United States Patent
Sedighi

(10) Patent No.: US 12,244,322 B2
(45) Date of Patent: Mar. 4, 2025

(54) ALIAS REJECTION IN ANALOG-TO-DIGITAL CONVERTERS (ADCS)

(71) Applicant: QUALCOMM Incorporated, San Diego, CA (US)

(72) Inventor: Behnam Sedighi, La Jolla, CA (US)

(73) Assignee: QUALCOMM Incorporated, San Diego, CA (US)

(*) Notice: Subject to any disclaimer, the term of this patent is extended or adjusted under 35 U.S.C. 154(b) by 244 days.

(21) Appl. No.: 17/932,572

(22) Filed: Sep. 15, 2022

(65) Prior Publication Data

US 2024/0097694 A1 Mar. 21, 2024

(51) Int. Cl.
| | | |
|---|---|---|
| *H03M 1/12* | (2006.01) | |
| *H03M 1/46* | (2006.01) | |
| *H03M 1/00* | (2006.01) | |

(52) U.S. Cl.
CPC ......... *H03M 1/1265* (2013.01); *H03M 1/466* (2013.01); *H03M 1/00* (2013.01); *H03M 1/12* (2013.01); *H03M 1/1225* (2013.01)

(58) Field of Classification Search
CPC .... H03M 1/1265; H03M 1/1225; H03M 1/00; H03M 1/466; H03M 1/12
See application file for complete search history.

(56) References Cited

U.S. PATENT DOCUMENTS 8,711,026 B1* 4/2014 Kappes ................. H03M 1/007
341/155

FOREIGN PATENT DOCUMENTS

| EP | 2744112 A2 | 6/2014 |
|---|---|---|
| EP | 3720002 A1 | 10/2020 |

OTHER PUBLICATIONS

Dong L., et al., "A 2-GS/s 200-MHz BW Oversampling Continuous-Time Pipeline ADC with Adaptive Digital Filter in 28nm", 2021 IEEE International Conference on Integrated Circuits, Technologies and Applications, Nov. 24, 2021, pp. 245-246, XP033996982, Section I, Section II, Figures 1,3.
Manivannan S., et al., "Improved Multistage Continuous-Time Pipelined Analog-to-Digital Converters and the Implicit Decimation Property", IEEE Transactions on Circuits and Systems-I: Regular Papers, US, vol. 69, No. 8, Aug. 1, 2022, pp. 3102-3113, XP011915388, Figure 10.
Partial International Search Report—PCT/US2023/073998—ISA/EPO—Jan. 5, 2024.
International Search Report and Written Opinion—PCT/US2023/073998—ISA/EPO—Apr. 12, 2024.
Oh S., et al., "A 80dB DR 6MHz Bandwidth Pipelined Noise-Shaping SAR ADC with 1-2 MASH Structure", 2020 IEEE Custom Integrated Circuits Conference (CICC), IEEE, Mar. 22, 2020, 4 Pages, XP033762138, Section II, Figure 3.

(Continued)

*Primary Examiner* — Joseph J Lauture
(74) *Attorney, Agent, or Firm* — Patterson+ Sheridan, L.L.P.

(57) ABSTRACT

Techniques and apparatus for alias rejection in analog-to-digital converters (ADCs), in which only a portion of the ADC is operated at a higher sampling rate than other portions of the ADC, thereby preventing aliasing, but saving power. One example ADC circuit generally includes a first circuit portion configured to operate at a first clock rate equal to a sampling rate of the ADC circuit; and a second circuit portion configured to operate at a second clock rate higher than the sampling rate of the ADC circuit.

40 Claims, 10 Drawing Sheets

(56) References Cited

OTHER PUBLICATIONS

Park S., et al., "A Low-Power, High-Linearity Wideband 3.25 GS/s Fourth-Order Programmable Analog FIR Filter Using Split-CDAC Coefficient Multipliers", IEEE Transactions on Microwave Theory and Techniques, vol. 68, No. 4, Apr. 1, 2020, pp. 1576-1590, XP011781464, Figures 2,3.

Whitcombe A., et al., "A Dual-Mode Configurable RF-to-Digital Receiver in 16nm FinFET ", 2018 IEEE Symposium on VLSI Circuits, IEEE, Jun. 18, 2018, pp. 23-24, XP033427755, p. 23, Figures 1-3.

\* cited by examiner

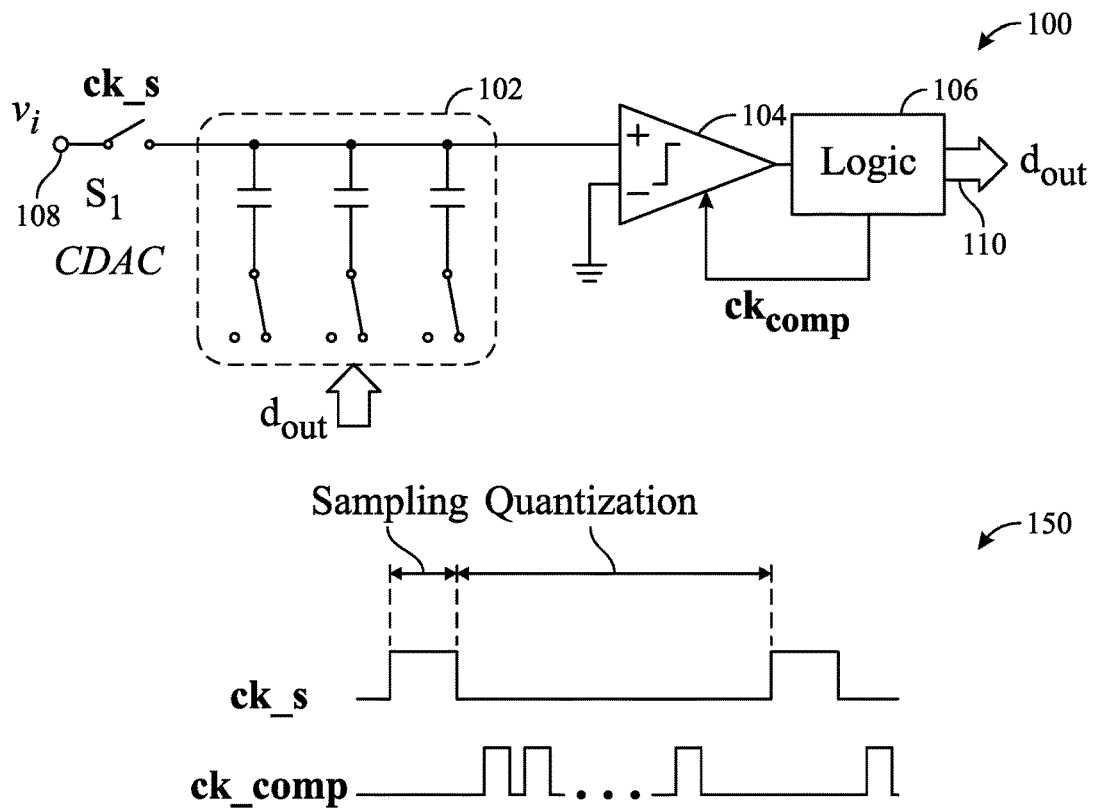
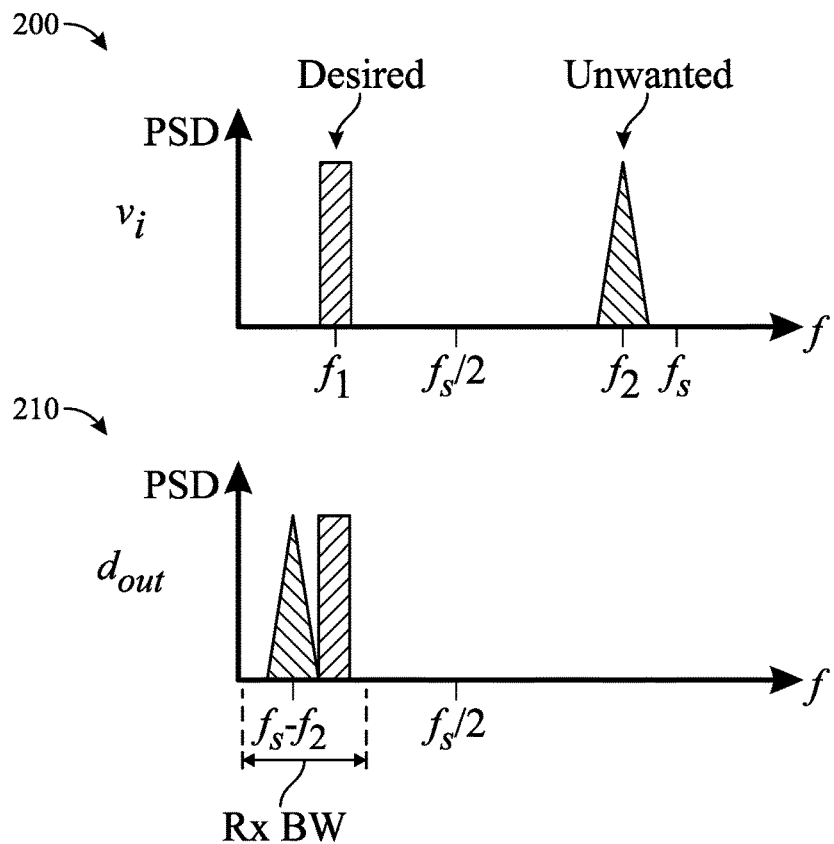
FIG. 2

ALIAS REJECTION IN ANALOG-TO-DIGITAL CONVERTERS (ADCS)

FIELD OF THE DISCLOSURE

Certain aspects of the present disclosure generally relate to electronic components and, more particularly, to analog-to-digital converters (ADCs).

BACKGROUND

An analog-to-digital converter (ADC) is an electronic circuit used to convert an analog signal to a digital signal, typically for performing signal processing in the digital domain. Several types of ADCs are available, each with varying advantages and disadvantages that make some ADC types more suitable for particular applications than others. For example, a successive approximation register (SAR) ADC may provide an area and power-efficient architecture for low-to-medium accuracy analog-to-digital conversion applications. A SAR ADC may use a digital-to-analog converter (DAC) and a comparator to approximate a digital value corresponding to an analog input. Another type of ADC referred to as a flash ADC may provide a faster conversion speed at the cost of an exponential increase in power and area consumption compared to a SAR ADC. Another type of ADC with faster sampling rates than SAR ADCs, but lower power and area consumption than flash ADCs is referred to as a pipelined ADC.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure generally relate to analog-to-digital converter (ADC) circuits with integrated aliasing rejection, where a portion of the ADC circuit is operated at a higher sampling rate than other portions of the ADC circuit.

Certain aspects of the present disclosure provide an analog-to-digital converter (ADC) circuit. The ADC circuit generally includes a first circuit portion and a second circuit portion. The first portion is configured to operate at a first clock rate equal to a sampling rate of the ADC circuit, and the second circuit portion is configured to operate at a second clock rate higher than the sampling rate of the ADC circuit.

Certain aspects of the present disclosure provide a pipelined ADC circuit. The pipelined ADC circuit generally includes a plurality of stages. one or more latter stages in the plurality of stages are configured to operate at a first clock rate equal to a sampling rate of the pipelined ADC circuit, and one or more initial stages in the plurality of stages are configured to operate at a second clock rate higher than the sampling rate of the pipelined ADC circuit.

Certain aspects of the present disclosure provide a successive-approximation register (SAR) ADC circuit. The SAR ADC circuit generally includes a plurality of capacitive digital-to-analog converters (CDACs) and a multi-input comparator. The multi-input comparator has a plurality of inputs coupled to outputs of the plurality of CDACs. The multi-input comparator is configured to operate at a first clock rate equal to a sampling rate of the SAR ADC circuit, and the plurality of CDACs is configured to operate at a second clock rate higher than the sampling rate of the SAR ADC circuit.

Certain aspects of the present disclosure provide a method of signal conversion. The method generally includes converting, using an ADC circuit, an analog signal to a digital signal at a sampling rate of the ADC circuit. The converting involves operating a first circuit portion of the ADC circuit at a first clock rate equal to the sampling rate of the ADC circuit and operating a second circuit portion of the ADC circuit at a second clock rate higher than the sampling rate of the ADC circuit.

Certain aspects of the present disclosure provide a method of signal conversion. The method generally includes converting, using a pipelined ADC circuit, an analog signal to a digital signal at a sampling rate of the pipelined ADC circuit. The pipelined ADC circuit generally includes a plurality of stages. The converting generally involves operating one or more latter stages in the plurality of stages at a first clock rate equal to the sampling rate of the pipelined ADC circuit and operating one or more initial stages in the plurality of stages at a second clock rate higher than the sampling rate of the pipelined ADC circuit.

Certain aspects of the present disclosure provide a method of signal conversion. The method generally includes converting, using a SAR ADC circuit, an analog signal to a digital signal at a sampling rate of the SAR ADC circuit. The SAR ADC circuit generally includes a plurality of CDACs and a multi-input comparator, the multi-input comparator having a plurality of inputs coupled to outputs of the plurality of CDACs. The converting generally involves operating the multi-input comparator at a first clock rate equal to the sampling rate of the ADC circuit and operating the plurality of CDACs at a second clock rate higher than the sampling rate of the SAR ADC circuit.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

FIG. 1 is a block diagram of an example successive approximation register (SAR) analog-to-digital converter (ADC) circuit, in which aspects of the present disclosure may be practiced, and a corresponding timing diagram.

FIG. 2 provides example power spectrums illustrating aliasing of unwanted frequencies into the band of interest due to sampling.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 3:
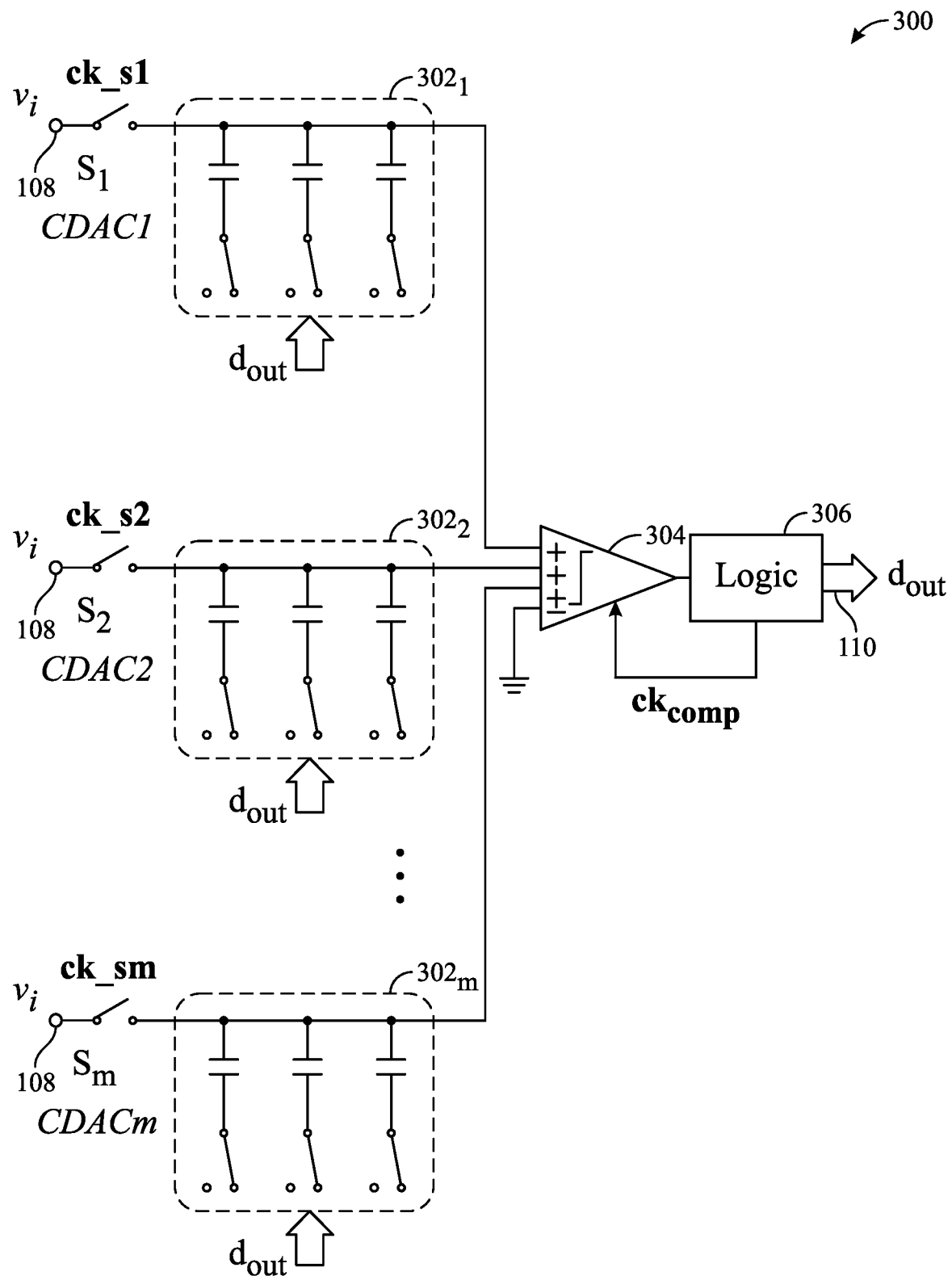
FIG. 3 is a block diagram of an example SAR ADC circuit with a plurality of capacitive digital-to-analog converters (CDACs) and a multi-input comparator to implement an analog finite impulse response (FIR) filter to reduce aliasing, in accordance with certain aspects of the present disclosure.

Certain aspects of the present disclosure generally relate to analog-to-digital converter (ADC) circuits with integrated aliasing rejection, where a portion of the ADC circuit is operated at a higher sampling rate than other portions of the ADC circuit. For example, in a successive approximation register (SAR) ADC, multiple capacitive digital-to-analog converters (CDACs) may be coupled to a multi-input comparator to implement an analog finite impulse response (FIR) filter effectively integrated into the SAR operation. As another example, in a pipelined ADC, the initial stage(s) have a higher sampling rate than the latter stage(s), and additional anti-aliasing circuitry may be used in both the analog and digital paths in the initial stage(s). By operating only a portion of the ADC circuit at a higher sampling rate than other portions of the ADC circuit, the ADC circuit may implement alias rejection, but may save power compared to designs where the entire ADC circuit operates at the higher sampling rate.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Successive Approximation Register Analog-to-Digital Converter

As described above, several different types of analog-to-digital converters (ADCs) exist, each with varying advantages and disadvantages that make some ADC types more suitable for particular applications than others. A successive approximation register (SAR) ADC may provide an area and power-efficient architecture for low-to-medium accuracy analog-to-digital conversion applications. A SAR ADC may use a digital-to-analog converter (DAC), a comparator, and logic to convert an analog input signal (a continuous waveform) into a digital output signal (a discrete-time representation). A SAR ADC may use a binary search through different quantization levels (e.g., different DAC steps) before converging upon the final digital signal for outputting from the SAR ADC.

FIG. 1 is a block diagram of an example SAR ADC circuit 100 and a corresponding timing diagram 150. As illustrated in FIG. 1, the SAR ADC circuit 100 is implemented as a charge-redistribution successive-approximation ADC, and as such, includes a capacitive digital-to-analog converter (CDAC) 102 (also referred to as a "charge-scaling DAC"). The CDAC 102 may include a switched array of binary-weighted capacitors. In addition to the CDAC 102, the SAR ADC circuit 100 includes a sample-and-hold switch S1, a comparator 104, and SAR logic 106. The switch S1 may be coupled between an input node 108 of the SAR ADC circuit 100 and an output of the CDAC 102, which is also coupled to the positive input of the comparator 104. The negative input of the comparator 104 may be coupled to a reference potential node (e.g., electrical ground) of the SAR ADC circuit 100, and the output of the comparator 104 may be coupled to an input of the SAR logic 106. The SAR logic may have an output 110 reflecting the digital signal during quantization (e.g., during the binary search process) and the final digital signal at the end of quantization. The output 110 may be fed back to the input of the CDAC 102, as illustrated in FIG. 1. The analog input signal (labeled "$v_i$") is provided to the input node 108, and the digital output signal (labeled "$d_{out}$") is available at the output 110 of the SAR logic 106.

As illustrated in the timing diagram 150, the operation of the sample-and-hold switch S1 may be controlled by a sampling clock signal (labeled "ck_s"), which samples the analog input signal ($v_i$) at the sampling rate ($f_s$, also referred to as the "sampling frequency") of the SAR ADC circuit 100. The comparator 104 may be controlled by a comparator clock (labeled "$ck_{comp}$" and also referred to as "a quantization clock"), which may be provided by the SAR logic 106, as shown. During the conversion process, a SAR ADC with a nominal resolution of N bits may make N comparisons with the comparator 104 and generate a digital output signal with N bits. Thus, the comparator clock ($ck_{comp}$) may have N pulses during each quantization interval.

Example Aliasing and Alias Rejection

The analog input signal ($v_i$) may be composed not only of the desired signal, but may also be received at the input of an ADC (e.g., at the input node 108 of the SAR ADC circuit 100) with unwanted signals. These unwanted signals may be out-of-band signals and may be referred to as "jammers," such as in wireless communications and other applications. While it may be possible to filter out some unwanted out-of-band signals before this signal content reaches the ADC, other unwanted signals may be folded back into the frequency band of interest due to aliasing and may be more challenging to reject.

FIG. 2 includes a power spectrum 200 for an example analog input signal ($v_i$) in which the power spectral density (PSD) of a desired signal at a first frequency ($f_1$) is similar to the PSD of an unwanted signal at a second frequency ($f_2$). In this example, an ADC may sample the analog input signal with a sampling rate of $f_s$. The first frequency is in a band of interest (labeled "Rx BW" for the receiver bandwidth), and while the second frequency is outside the band of interest, the second frequency is less than the sampling rate of the ADC (but more than the Nyquist rate $f_s/2$).

The sampling operation inside ADCs—that is converting the analog input signal from the continuous-time domain to a digital output signal in the discrete-time domain—causes the content of the power spectrum 200 at frequencies above the Nyquist rate to fold back into the zone between 0 and $f_s/2$, as illustrated in the power spectrum 210 for the digital output signal ($d_{out}$). In the power spectrum 210, the unwanted signal near $f_s$ has aliased back into the band of interest (Rx BW) due to the nature of sampling and now appears at a frequency of $f_s-f_2$. Such an aliased jammer will degrade the signal-to-noise ratio (SNR) of the ADC and may decrease the effective resolution (i.e., reduce the effective number of bits (ENOB)).

A number of techniques have been implemented to handle such aliasing due to sampling. One technique is to precede the ADC with an analog anti-aliasing filter (AAF) to suppress the undesired signals before sampling, such that the unwanted signal folded back into the band of interest has much lower power and may not decrease the effective resolution. The AAF can be implemented in continuous time (e.g., a biquad low-pass filter) or in discrete time (e.g., a FIR filter running at a higher rate than the sampling rate of the ADC). However, it may be challenging in certain space-limited applications to design an analog AAF with a suitably steep roll-off for anti-aliasing that does not occupy too much area. Another technique is to raise the sampling rate of the ADC to prevent aliasing and to perform filtering in the digital domain after sampling. In this manner, complex, high-order digital filters can be used for alias rejection. Time interleaving is one example method for increasing the sampling rate.

Example SAR ADC Circuits with Integrated Alias Rejection

As yet another technique for addressing aliasing, certain aspects of the present disclosure provide a SAR ADC circuit that includes a discrete-time filter (e.g., a finite impulse response (FIR) filter inside the SAR operation, such that instead of quantizing a single input sample, a linear combination of a few consecutive samples is quantized. To accomplish this, the SAR ADC circuit may include multiple capacitive digital-to-analog converters (CDACs) and a multi-input comparator, where the inputs of the comparator are presented with different combinations of input samples and DAC signals over time. In this manner, effectively only a portion of the ADC is operating at a higher rate than the sampling rate ($f_s$), preventing aliasing, but saving power (compared to implementations where the entire ADC is operated at the higher rate).

FIG. 3 is a block diagram of an example SAR ADC circuit 300 implementing an analog FIR filter inside the SAR operation to reduce aliasing, in accordance with certain aspects of the present disclosure. The SAR ADC circuit 300 comprises a number m of sample-and-hold switches S1, S2, . . . , Sm; an equivalent number m of CDACs $302_1$, $302_2$, . . . , $302_m$ (collectively referred to herein as "CDACs 302"); a multi-input comparator 304; and SAR logic 306. Each of the CDACs 302 may include a switched array of binary-weighted capacitors, for example. Each of the sample-and-hold switches S1, S2, . . . , Sm may be controlled by a respective sample clock signal ck_s1, ck_s2, . . . , ck_sm. Furthermore, each of the sample-and-hold switches S1, S2, . . . , Sm may be coupled between the input node 108 of the SAR ADC circuit 300 and an output of a corresponding CDAC, which is also coupled to a respective positive input of the multi-input comparator 304. In other words, the multi-input comparator 304 has multiple positive inputs that are coupled to outputs of the CDACs 302, where one CDAC output may be coupled to one comparator input. The negative input of the multi-input comparator 304 may be coupled to a reference potential node (e.g., electrical ground) of the SAR ADC circuit 300, and the output of the comparator 304 may be coupled to an input of the SAR logic 306. The inputs of the multi-input comparator 304 have different weights, which may be implemented by different sizes of input transistors in the multi-input comparator.

Figure 4:
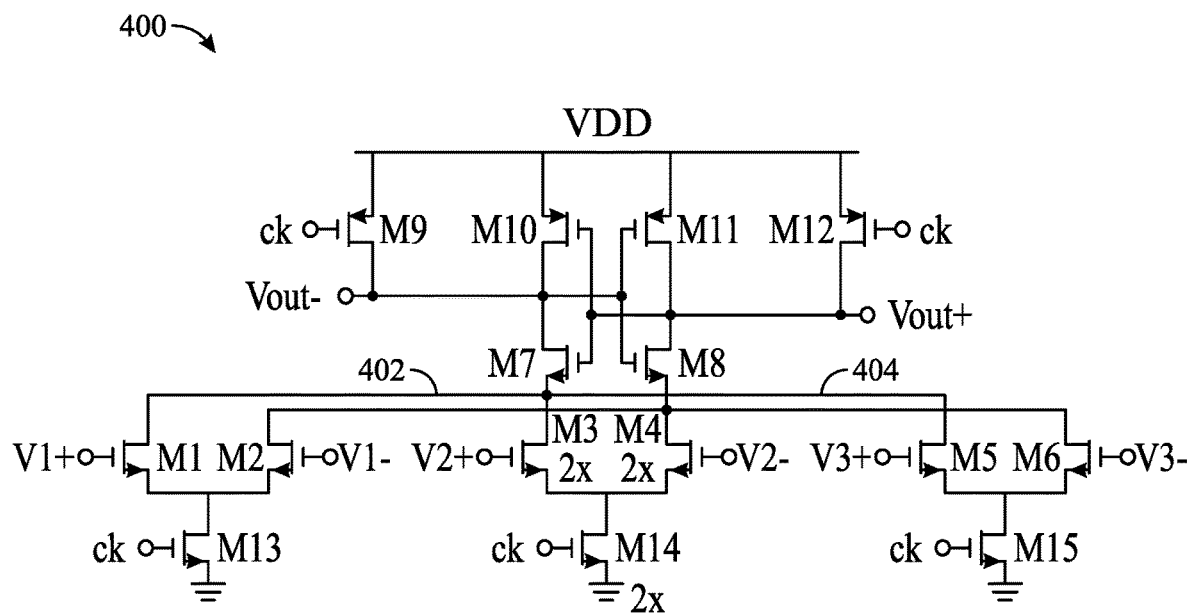
FIG. 4 is a circuit diagram of an example multi-input comparator, in accordance with certain aspects of the present disclosure.

FIG. 4 is a circuit diagram of an example multi-input comparator 400, in accordance with certain aspects of the present disclosure. The multi-input comparator 400 may be used to implement the multi-input comparator 304 of FIG. 3, with three differential input signals. Although three differential input signals are illustrated in the multi-input comparator 400 of FIG. 4, it is to be understood that the multi-input comparator may be implemented with two, four, or more input signals, which may be differential or single-ended.

As illustrated in FIG. 4, the multi-input comparator 400 may include transistors M1-M15, where transistors M1-M8 and M13-15 are implemented as n-type field-effect transistors (NFETs) and where transistors M9-M12 are implemented as p-type field-effect transistors (PFETs). The multi-input comparator 400 may include multiple input transistor pairs coupled in parallel. As such, the drains of transistors M1, M3, and M5 may be coupled to the same node 402, and the drains of transistors M2, M4, and M6 may be coupled to the same node 404. The gates of transistors M1 and M2 may receive a first differential input signal V1+/V1−, the gates of transistors M3 and M4 may receive a second differential input signal V2+/V2−, and the gates of transistors M5 and M6 may receive a third differential input signal V3+/V3−. To implement the single-ended SAR ADC circuit 300 of FIG. 3, the gates of transistors M2, M4, and M6 for the complementary differential input signals (e.g., V1−, V2−, and V3−) may be coupled to the reference potential node (e.g., electrical ground) of the SAR ADC circuit. Transistors M13-M15 may function as tail transistors of the input transistor pairs, each tail transistor having a drain coupled to the sources of the respective input transistor pair and having a source coupled to a reference potential node (e.g., electrical ground) for the multi-input comparator 400.

The sources of transistors M9-M12 may be coupled to a power supply rail (labeled "VDD"), where the drains of transistors M11 and M12, the gate of transistor M10, and the drain of transistor M8 may be coupled to a positive output node (labeled "Vout+") and where the drains of transistors M9 and M10, the gate of transistor M11, and the drain of transistor M7 may be coupled to a negative output node (labeled "Vout−") for the comparator. The source of transistor M7 may be coupled to node 402, and the source of transistor M8 may be coupled to node 404. The gates of transistors M9, M12, and M13-15 may be coupled to a clock node (labeled "ck," which may receive a comparator clock signal, such as $ck_{comp}$).

The weighting of a desired FIR function may be implemented by the proper sizing of the transistors in the comparator 400. For example, to implement a FIR filter with coefficients $[a_1\ a_2\ a_3]=[1\ 2\ 1]$, the transistors in input transistor pair M3 and M4 (and tail transistor M14) may each be two times larger than the transistors in input transistor pair M1 and M2 (and tail transistor M13) and in input transistor pair M5 and M6 (and tail transistor M15), as illustrated in FIG. 4. In this manner, the different inputs of the multi-input comparator may be designed to have different weights. Although the weights are integers in this example, it is to be understood that the weights (as implemented by the gain of the transistors) may be any positive real number. If a comparator input is not used for a certain conversion, the clock to the gate of the corresponding tail transistor for that input transistor pair may be disabled. This may present a high input impedance on that particular input, which may avoid distorting the CDAC voltage corresponding to that comparator input.

Returning to FIG. 3, the SAR logic 306 may have an output 110 reflecting the digital signal ($d_{out}$) during quantization (e.g., during the binary search process) and the final digital signal at the end of quantization. The output 110 may be fed back to the inputs of the CDACs 302, as illustrated in FIG. 3. The SAR logic 306 may be configured to produce the digital output signal at the output thereof according to the sampling rate ($f_s$) of the SAR ADC circuit 300.

In the SAR ADC circuit 300, the digital output signal ($d_{out}$) is a linear weighted combination of different samples in the time domain of the input voltage signal ($v_i$) at the input node 108, based on an operation of the switches S1, S2, . . . , Sm. In other words, the digital output signal ($d_{out}$) is a linear weighted combination of the input signal and one or more delayed versions of the input signal, according to the equation below:

$$d_{out}=a_1v_i[k]+a_2v_i[k-1]+\ldots+a_nvi[k-n+1]$$

where $a_1, a_2, \ldots, a_n$ are the coefficients of an n-tap FIR filter, $v_i[k]$ is the current input voltage signal sample, $v_i[k-1]$ is the immediately previous sample, and $vi[k-n+1]$ is the $n^{th}-1$ previous sample in time. The rate of the FIR filter is determined by the sample clock signals $ck\_s1, ck\_s2, \ldots, ck\_sm$ and is higher than the ADC sampling rate ($f_s$). As described above, the coefficients $a_1, a_2, \ldots, a_n$ of the SAR-integrated FIR filter are set by assigning weights to the inputs of the multi-input comparator 304 (e.g., the parallel input transistor size ratios). Furthermore, the weighted addition of the consecutive samples is performed by the comparator 304, as explained below.

Although FIG. 3 illustrates the SAR ADC circuit 300 implemented as a single-ended circuit, it is to be understood that the SAR ADC circuit may be implemented as a fully differential circuit. In this case, the input analog signal will be a differential signal, the CDACs have positive and negative arrays of switched capacitors, and the comparator inputs are differential (as illustrated in the multi-input comparator 400 of FIG. 4).

Figure 5:
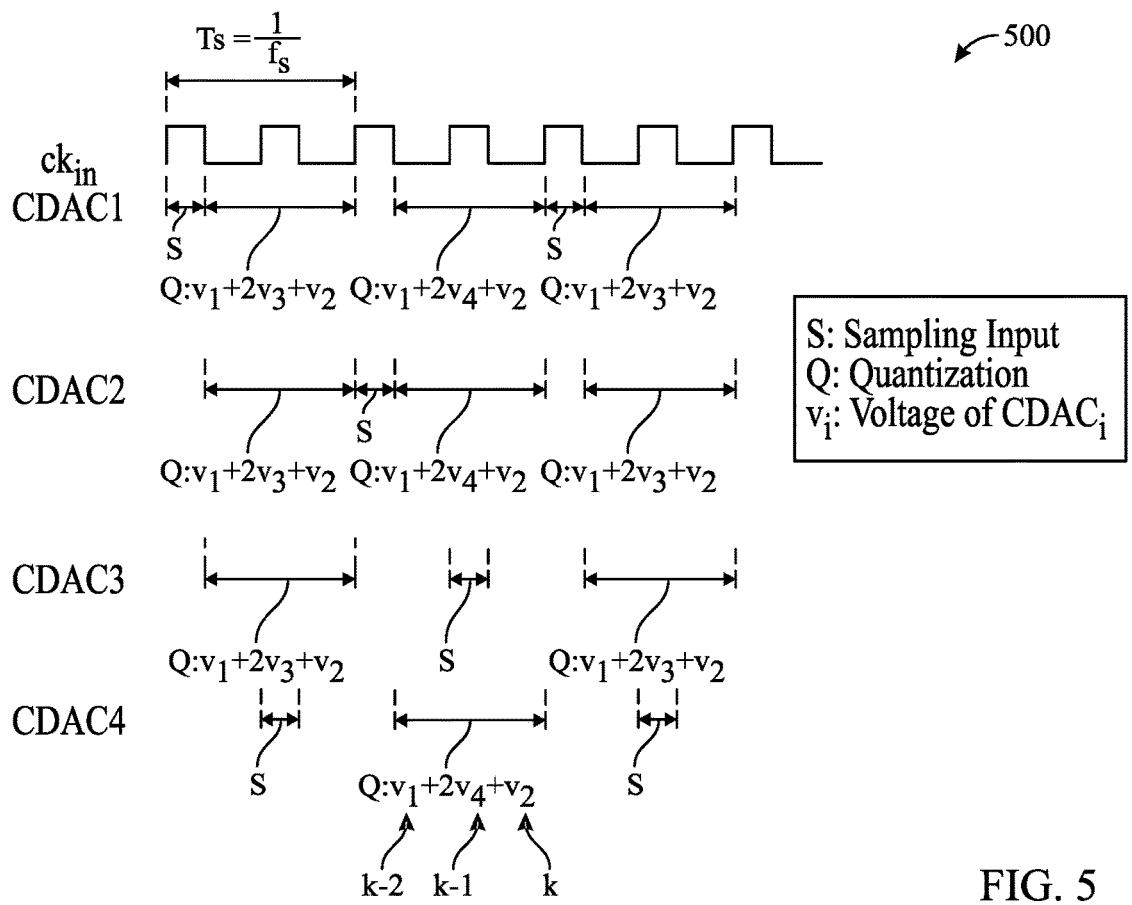
FIG. 5 is an example timing diagram for an example implementation of the SAR ADC circuit of FIG. 3, in accordance with certain aspects of the present disclosure.

FIG. 5 is an example timing diagram 500 for an example implementation of the SAR ADC circuit 300 of FIG. 3 with m=4 CDACs and a FIR filter with n=3 taps running at twice the sampling rate of the SAR ADC circuit (at $2f_s$), in accordance with certain aspects of the present disclosure. Because the FIR filter has 3 taps, at least three CDACs 302 (CDAC1, CDAC2, and CDAC3) may be involved in the quantization, during which time the SAR loop is operating. However, because the FIR filter is designed to run at $2f_s$ in this example, a new sample should be taken every $(2f_s)^{-1}$ (as illustrated by the input clock signal (labeled "$ck_{in}$"). Therefore, a fourth CDAC (CDAC4) is utilized in this example to sample the input voltage signal ($v_4$) while the other three CDACs (CDAC1, CDAC2, and CDAC3) are busy in the SAR loop.

Thus, as shown in the timing diagram 500, one of the four CDACs is sampling (indicated by "S") in the middle of a conversion (indicated by "Q" for quantization) performed by the other three CDACs. Here, $v_i$ indicates the voltage of the corresponding CDACi, so $v_1$ indicates the voltage at the output of CDAC1, $v_2$ indicates the voltage at the output of CDAC2, $v_3$ indicates the voltage at the output of CDAC3, and $v_4$ indicates the voltage at the output of CDAC4. During each period Ts ($=1/f_s$), the SAR ADC circuit 300 completes a cycle of sampling and quantization. The sampling order is repeated as sample-and-hold switches S1, S4, S2, and S3, as controlled by pulses on sampling clock signals $ck\_s1, ck\_s4, ck\_s2$, and $ck\_s3$. In this manner, each individual sampling clock signal (e.g., $ck\_s1$) samples the analog input signal ($v_i$) every 2 Ts ($=2/f_s$).

To implement a FIR filter with coefficients [1 2 1] (i.e., where $a_1=1, a_2=2$, and $a_3=1$), the inputs to the multi-input comparator 304 from the outputs of CDAC1 and CDAC2 are weighted with a coefficient of 1, whereas the inputs to the multi-input comparator 304 from the outputs of CDAC3 and CDAC4 are weighted with a coefficient of 2.

Therefore, according to the sampling order as presented above and shown in the timing diagram 500, the $k^{th}$ sample may be a voltage $v_2$ at the output of CDAC2, the $k^{th}-1$ sample may be a voltage $v_4$ (or $v_3$) at the output of CDAC4

(or CDAC3), and the $k^{th}-2$ sample may be a voltage $v_1$ at the output of CDAC1. In other words, the timing is set up such that voltages $v_3$ and $v_4$ (at the output of CDAC3 and CDAC4) fall on the $k^{th}-1$ sample (and have a coefficient of 2) during each quantization.

The timing diagram 500 of FIG. 5 provides one example timing for implementing a 3-tap FIR filter running at $2f_s$ internal to a SAR ADC circuit. However, it is to be understood that other solutions with different timing (e.g., different sample ordering and/or a different FIR speed) are possible.

Figure 6:
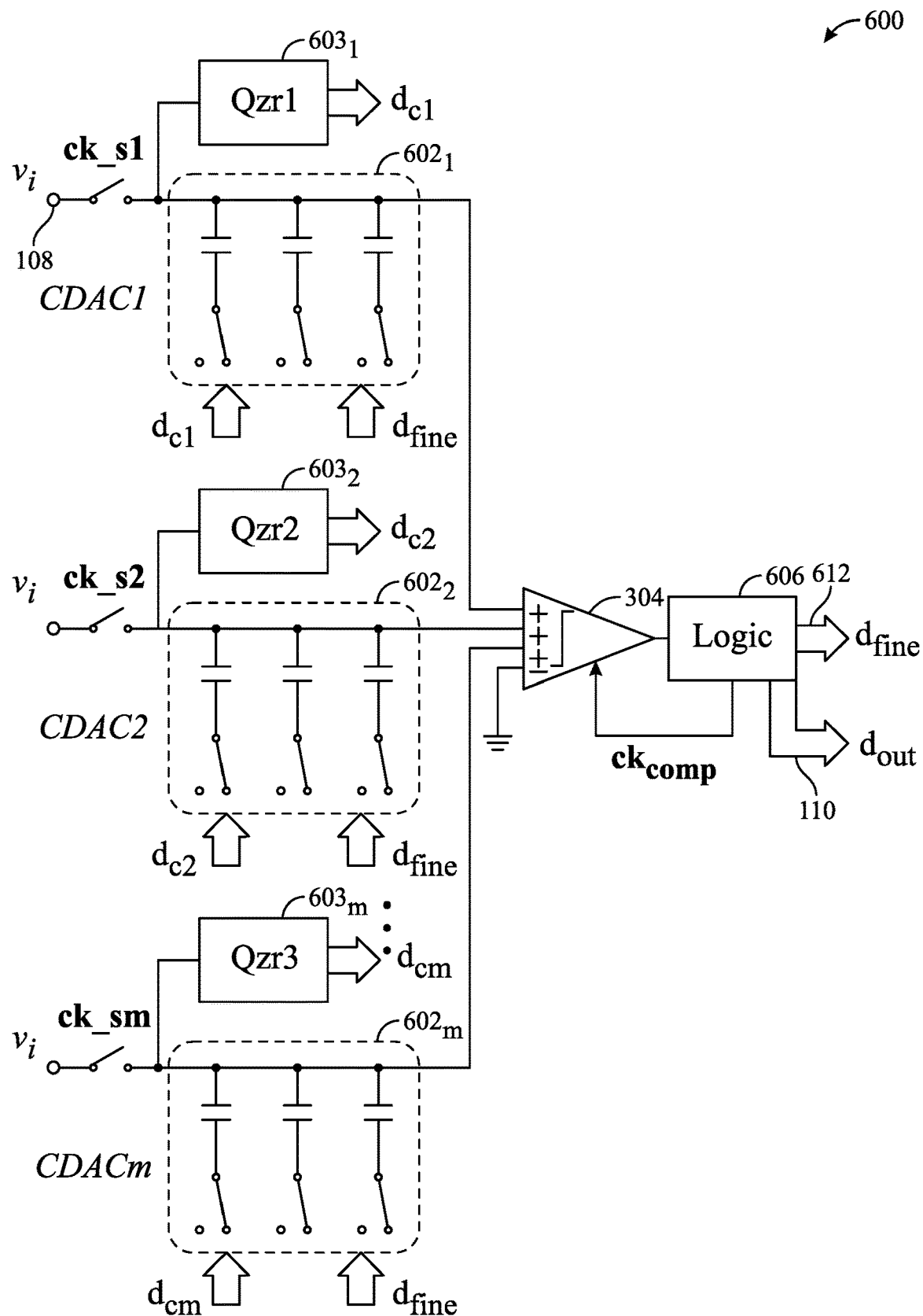
FIG. 6 is a block diagram of an example SAR ADC circuit with a plurality of CDACs, a plurality of quantizers for coarse quantization, and a multi-input comparator for fine quantization, in accordance with certain aspects of the present disclosure.

FIG. 6 is a block diagram of another example SAR ADC circuit 600 with internal alias rejection, in accordance with certain aspects of the present disclosure. The SAR ADC circuit 600 comprises a number m of sample-and-hold switches S1, S2, ..., Sm; an equivalent number m of CDACs $602_1$, $602_2$, ..., $602_m$ (collectively referred to herein as "CDACs 602"); an equivalent number m of quantizers $603_1$, $603_2$, ..., $603_m$ (collectively referred to herein as "quantizers 603") for coarse quantization; a multi-input comparator 304 for fine quantization; and SAR logic 606. Each of the CDACs 602 may include a switched array of binary-weighted capacitors, for example. Each of the sample-and-hold switches S1, S2, ..., Sm may be controlled by a respective sample clock signal ck_s1, ck_s2, ..., ck_sm. Furthermore, each of the sample-and-hold switches S1, S2, ..., Sm may be coupled between the input node 108 of the SAR ADC circuit 600 and an output of a corresponding CDAC, which is also coupled to a respective positive input of the multi-input comparator 304 and to an input of a corresponding quantizer.

The quantizers 603 may be implemented by relatively low-resolution (e.g., 4-bit) ADCs for coarse quantization. Each of the quantizers 603 has a respective coarse digital output $d_{c1}$, $d_{c2}$, ..., $d_{cm}$, which is coupled to higher significant bit control inputs (e.g., one or more most significant bits (MSBs)) of a respective CDAC, as illustrated in FIG. 6.

The coarse quantization from a quantizer is effectively subtracted from the sampled input signal by the respective CDAC. Thus, inputs of the multi-input comparator 304 represent the residue (i.e., the quantization error) of the quantizer and hence are small. This prevents, or at least reduces, non-linearity of the comparator 304.

The output of the comparator 304 may be coupled to an input of the SAR logic 606. The SAR logic 606 may have an output 612 reflecting the fine digital output $d_{fine}$ during quantization (e.g., during the binary search process), which is coupled to lower significant bit control inputs (e.g. one or more least significant bits (LSBs)) of each of the CDACs 602, as illustrated in FIG. 6. The SAR logic 606 (or other logic, not shown) may have an output 110 reflecting the final digital signal ($d_{out}$) at the end of quantization, which is the weighted addition of a coarse quantization from one of the plurality of quantizers ($d_{ci}$) and the fine quantization $d_{fine}$. The SAR logic 606 (or other logic) may be configured to produce the digital output signal at the output 110 according to the sampling rate ($f_s$) of the SAR ADC circuit 600.

According to certain aspects, the final digital signal ($d_{out}$) at the end of quantization may be constructed based on the coarse quantization outputs ($d_{c1}$, $d_{c2}$, ..., $d_{cm}$) from the plurality of quantizers 603 and the fine quantization $d_{fine}$. This implementation may be utilized in one or more of the techniques and apparatus described below.

Figure 7:
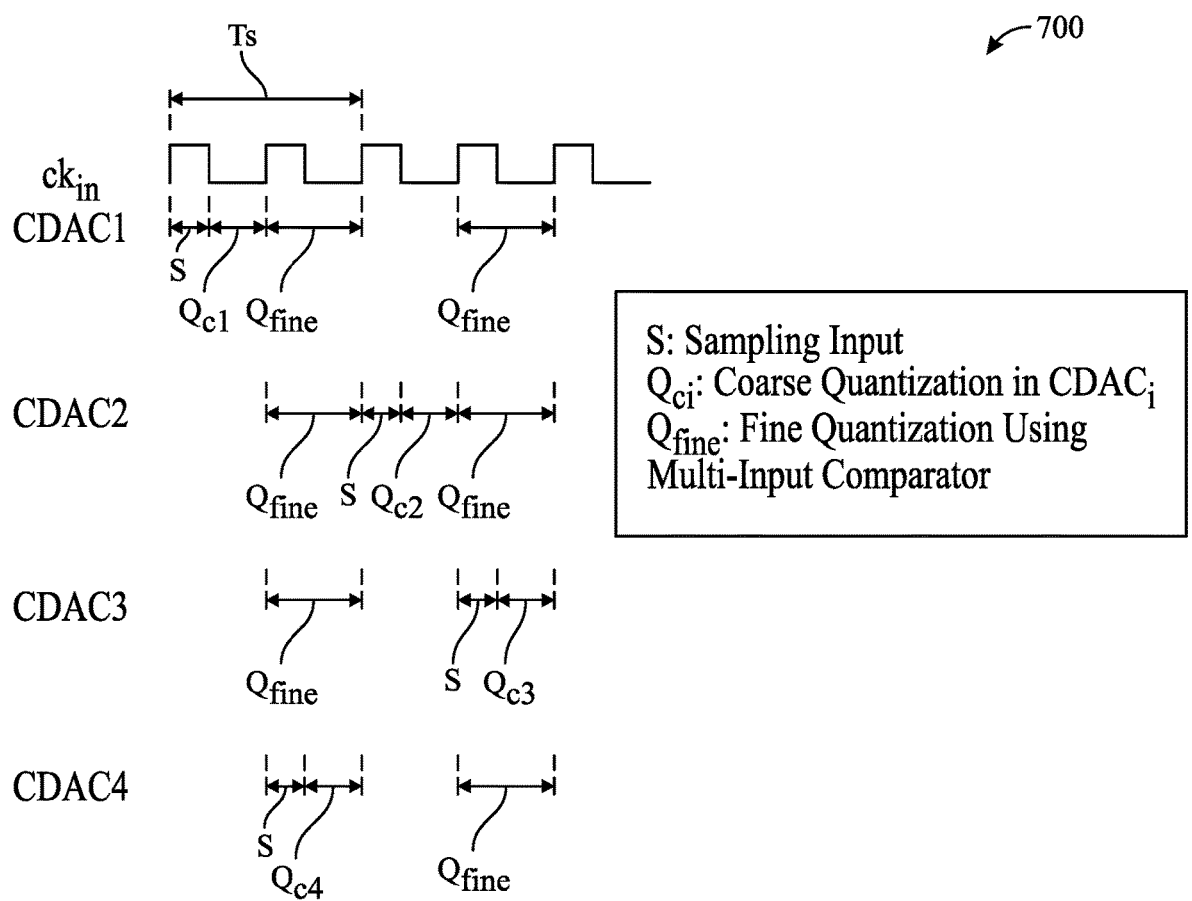
FIG. 7 is an example timing diagram for the example SAR ADC circuit of FIG. 6, in accordance with certain aspects of the present disclosure.

FIG. 7 is an example timing diagram 700 for the example SAR ADC circuit 600 of FIG. 6 with m=4 CDACs (CDAC1-CDAC4) and a multi-input comparator running at twice the sampling rate of the SAR ADC circuit (at $2f_s$), in accordance with certain aspects of the present disclosure.

Three CDACs 302 (e.g., CDAC1, CDAC2, and CDAC3) may be involved in the fine quantization, during which time the SAR loop is operating. However, because a new sample is designed to be taken every $(2f_s)^{-1}$ (as illustrated by the input clock signal (labeled "ck$_{in}$"), a fourth CDAC (CDAC4) is utilized in this example to sample the input voltage signal ($v_i$) and perform coarse quantization (during $Q_{c4}$) while the other three CDACs (CDAC1, CDAC2, and CDAC3) are busy in the SAR loop.

Thus, as shown in the timing diagram 700, one of the four CDACs is sampling (indicated by "S") during a fine quantization (indicated by "$Q_{fine}$") performed by the multi-input comparator based on inputs from the other three CDACs. Here, $Q_{ci}$ indicates the coarse quantization in the corresponding CDACi, so $Q_{c4}$ indicates the coarse quantization in CDAC4, for example. During each period Ts (=$1/f_s$), the SAR ADC circuit 600 completes a cycle of sampling and quantization (here, coarse quantization followed by fine quantization). The sampling order of sample-and-hold switches S1, S4, S2, and S3 is repeated, as controlled by pulses on sampling clock signals ck_s1, ck_s4, ck_s2, and ck_s3, in order. In this manner, each individual sampling clock signal (e.g., ck_s1) samples the analog input signal ($v_i$) every 2 Ts (=$2/f_s$).

The timing diagram 700 of FIG. 7 provides one example timing for implementing a SAR ADC circuit with internal alias rejection. However, it is to be understood that other solutions with different timing (e.g., different sample ordering) are possible.

Example Pipelined Analog-to-Digital Converter

Pipelined analog-to-digital converters (ADCs) and other multi-stage ADCs may be used for high-speed and power-efficient analog-to-digital conversion in a device, such as in a receive chain of a transceiver in a $5^{th}$ generation (5G) (or other radio access technology) wireless device. The pipelined ADC may be used, for example, with sampling rates from a few megasamples per second (Msps) to a thousand or so Msps and higher.

Figure 8A:
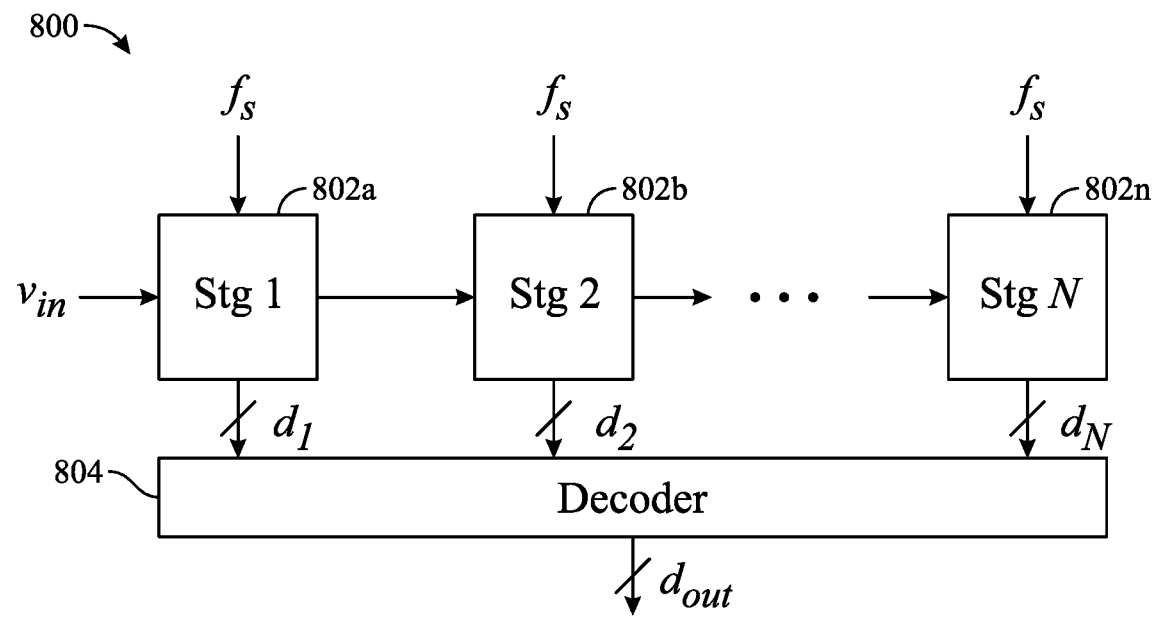
FIG. 8A is a block diagram of an example pipelined ADC circuit, in which aspects of the present disclosure may be practiced.

FIG. 8A is a block diagram of an example pipelined ADC circuit 800, but may also represent other multi-stage ADC circuits. The pipelined ADC circuit 800 includes N stages 802a, 802b, ..., 802n (collectively referred to herein as "stages 802") and a decoder 804 (also referred to as a "digital combiner"), where N is a positive integer greater than 1. Although illustrated as a single-ended ADC circuit, the pipelined ADC circuit 800 may alternatively be implemented as a differential ADC circuit.

A first stage (e.g., Stage 1) of the pipelined ADC circuit 800 may receive an analog input signal (labeled "$v_{in}$") for conversion to a digital output. Each stage of the pipelined ADC circuit 800 may be configured to output one or more bits (and an analog residue for passing to the next stage, as explained below). As shown in FIG. 8A, each stage may be clocked at the sampling frequency ($f_s$) of the pipelined ADC circuit 800 to produce that stage's output bit(s). The bit(s) (labeled "$d_1$") output by the first stage (e.g., Stage 1) of the pipelined ADC circuit 800 may represent the most significant bit(s) (MSB(s)) of the digital output (labeled "$d_{out}$"), and the bit(s) (labeled "$d_N$") output by the last stage (e.g., Stage N) of the pipelined ADC circuit 800 may represent least significant bit(s) (LSB(s)) of the digital output. The outputs from the stages are coupled to inputs of the decoder 804. The decoder 804 is used to combine the output bit(s)

from the stages 802 to generate a complete digital output. As illustrated, the digital output may be the sum of the bit(s) output by each of the stages of the pipelined ADC circuit 800 (e.g., after taking into consideration the relative significance of the bits).

Figure 8B:
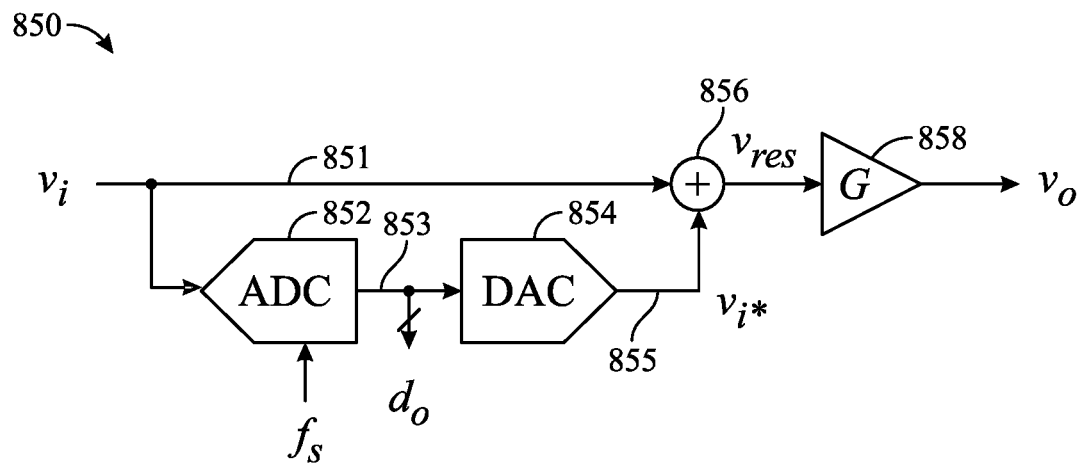
FIG. 8B is a block diagram of an example stage of the pipelined ADC circuit of FIG. 8A.

FIG. 8B is a block diagram of an example stage 850 of the pipelined ADC circuit 800 of FIG. 8A. The example stage 850 may represent any of the stages 802 in the pipelined ADC circuit, but for the last stage (e.g., Stage N). As illustrated, the stage 850 includes at least an ADC 852, a digital-to-analog converter (DAC) 854, an analog combiner 856, and an amplifier 858 (also referred to as a "gain stage"). The ADC 852 may be a relatively low-resolution ADC, and may be implemented by a flash ADC, for example, or any other suitable type of ADC.

The ADC 852 has one or more input nodes 851 for receiving one or more analog inputs (labeled "$v_i$" and referred to herein as a "stage input analog signal"). The one or more analog inputs may include the analog input signal to the pipelined ADC circuit 800 (in the case of the first stage) or a residue output of a preceding stage of the pipelined ADC circuit 800 after quantization (in the case of stages other than the first stage). Although illustrated with a single input node, in some cases the ADC 852 may alternatively be implemented with a pair of differential input nodes. The ADC 852 may generate a digital output (labeled "$d_o$") for the stage 850 at output node 853, based on the analog input(s) and at the sampling frequency ($f_s$) of the pipelined ADC circuit 800. Having an input coupled to an output of the ADC 852, the DAC 854 receives the digital output signal of the ADC 852 as an input signal. The DAC 854 converts the received digital input from the ADC 852 back into an analog voltage (referred to herein as a "stage intermediary analog signal" and labeled "$v_{i*}$") at node 855. Although illustrated with a single output node, the DAC 854 may alternatively be implemented with a pair of differential output nodes. The analog combiner 856 may then output a voltage difference between the analog input(s) to the stage and the analog output(s) from the DAC 854 (e.g., may subtract the stage intermediary analog signal at node 855 from the stage input analog signal at node 851). This voltage difference is referred to as a "residue voltage" of a given stage (or a "stage reside signal") and is labeled "$v_{res}$" in FIG. 8B. For certain aspects, the residue voltage may be amplified by the amplifier 858 before being output from the stage 850 as an output voltage (labeled "$v_o$" and also referred to as a "stage output analog signal"). The amplifier 858 may be implemented by any suitable type of amplifier. The residue voltage (or the amplified version thereof) may be used as an input for the following stage of the pipelined ADC circuit 800. Thus, each stage (with the typical exception of the last stage) may have two outputs: a digital output and a residue output.

Example Pipelined ADC Circuits with Integrated Alias Rejection

As described above with respect to FIG. 2, the sampling operation of an ADC (e.g., a pipelined or other multi-stage ADC) causes aliasing, where unwanted signals can fold back into the bandwidth of interest and degrade the signal-to-noise ratio (SNR) of the ADC. Instead of preceding the ADC with an analog anti-aliasing filter or increasing the sampling rate of the ADC, certain aspects of the present disclosure provide a pipelined ADC in which the initial one or more stages operate at a higher rate than the output rate ($f_s$) of the pipelined ADC. By operating only the initial stage (or initial few stages) at the higher rate, the pipelined ADC achieves alias rejection, but saves power over solutions in which all stages, and in particular, the interstage amplifier between stages, operate at the higher rate.

Figure 9A:
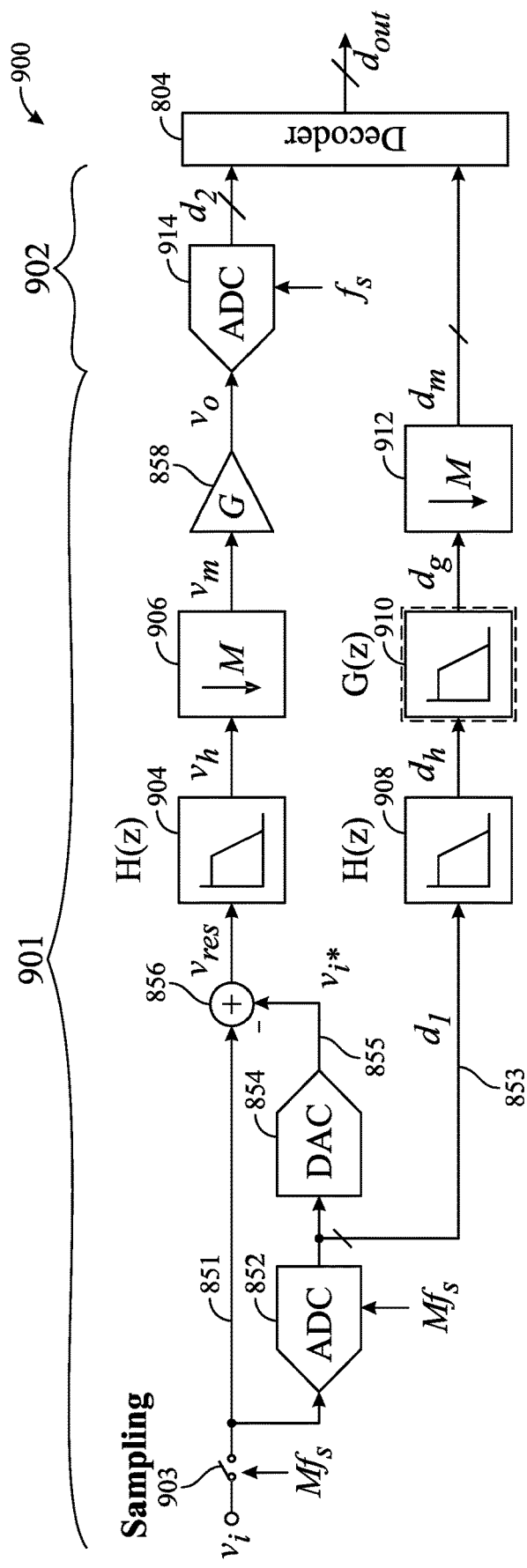
FIG. 9A is a block diagram of an example pipelined ADC circuit where an initial stage operates at a higher rate than the sampling rate of the ADC circuit, in accordance with certain aspects of the present disclosure.

FIG. 9A is a block diagram of an example pipelined ADC circuit 900 having two stages: an initial stage 901 followed by a last stage 902. The initial stage 901 is operated at a clock rate that is M times higher than the clock rate for the last stage 902, which equals the overall sample rate ($f_s$) of the pipelined ADC circuit, where M is any number greater than 1 and can be fractional (i.e., M need not be limited to integers). Although only one initial stage 901 is shown, it is to be understood that a pipelined or other multi-stage ADC circuit may include more than one initial stage operating at $Mf_s$. Furthermore, although only one last stage 902 is shown, it is to be understood that a pipelined or other multi-stage ADC circuit may include more than one latter stage operating at $f_s$. For certain aspects, the pipelined ADC circuit 900 may also include a sampling switch 903 for sampling the input voltage at the higher sampling rate ($Mf_s$).

In addition to the components described above with respect to the stage 850 in FIG. 8A, the initial stage 901 in FIG. 9A may also include an analog filter 904, an analog downsampler 906, a digital filter 908, and a digital downsampler 912. The analog filter 904 may have an input coupled to an output of the combiner 856, and the analog downsampler 906 may have an input coupled to an output of the analog filter 904. The analog downsampler 906 may also have an output coupled to the input of the amplifier 858. Similarly, the digital filter 908 may have an input coupled to an output of the ADC 852 at node 853, and the digital downsampler 912 may have an input coupled to an output of the digital filter 908. The digital downsampler 912 may also have an output coupled to an input of the decoder 804.

As illustrated in FIG. 9A, the analog filter 904 may have a transfer function of H(z) to implement an analog low-pass filter, for example. For certain aspects, this low-pass filter may be designed to filter out frequencies above the Nyquist frequency ($f_s/2$) for the pipelined ADC circuit 900 from the initial stage residue signal ($v_{res}$). The analog filter 904 may filter the initial stage residue signal ($v_{res}$) to generate an initial stage filtered residue signal (labeled "$v_h$"). Because the ADC 852 and the DAC 854 (and also the switch 903 in certain aspects) are operated at the higher sampling rate ($Mf_s$), the analog downsampler 906 may downsample the initial stage filtered residue signal to generate an initial stage downsampled residue signal (labeled "$v_m$") with lowered frequency content (e.g., more compatible with $f_s$). The analog downsampler 906 may not be an explicit component, and in this case, the operation thereof may be effectively performed by sampling the signal $v_h$ at a rate of $1/f_s$ by the subsequent components. In other words, the analog downsampler 906 may not be a physical circuit, but is shown in FIG. 9A to illustrate the parallelism between the analog and digital paths of the initial stage 901.

Similarly, the digital filter 908 may also have a transfer function of H(z) (or substantially equivalent to H(z)) to implement a digital low-pass filter, for example, which matches the frequency behavior of the analog filter 904. For certain aspects, this low-pass filter may be designed to filter out frequencies above the Nyquist frequency ($f_s/2$) for the pipelined ADC circuit 900 from the initial stage digital signal ($d_j$). The digital filter 908 may filter the initial stage digital signal ($d_j$) to generate an initial stage filtered digital signal (labeled "$d_h$"). Because the ADC 852 and the DAC 854 are operated at the higher sampling rate ($Mf_s$), the digital downsampler 912 may downsample the initial stage filtered digital signal to generate an initial stage downsampled digital signal (labeled "$d_m$") with lowered frequency content (e.g., more compatible with $f_s$). The digital downsampler 912 may downsample the signal $d_h$ by, for example, disregarding samples (e.g., keeping only every $M^{th}$ sample) or combining samples (e.g., combining every group of M samples into a single sample).

For certain aspects, the pipelined ADC circuit 900 may include another digital filter 910 between the digital filter 908 and the digital downsampler 912. In this case, an input of the digital filter 910 may be coupled to the output of the digital filter 908, and an output of the digital filter 910 may be coupled to the input of the digital downsampler 912. The digital filter 910 may have a transfer function of G(z) to implement another digital low-pass filter in the digital path of the initial stage 901. For example, the digital filter 910 may be implemented as a FIR filter. The transfer function G(z) may have a steeper roll-off and may implement a higher-order filter than the filter implemented by the H(z) transfer function. For certain aspects, the digital filter 910 may be programmable, such that the transfer function G(z) can be changed. In this manner, the digital filter 910 may provide a knob for adjusting alias rejection, ranging from no additional rejection to aggressive alias rejection. The digital filter 910 can implement a high-order filter, while occupying a relatively small area and dissipating relatively little power.

Furthermore, the digital filter 910 may be configured to be selectively bypassed or may be programmed to effectively have a unity transfer function (G(z)=1), (e.g., by a controller associated with the pipelined ADC circuit 900). For example, when the presence of a strong jammer (or other signal at an unwanted frequency with a relatively high power) is detected, the digital filter 910 may be used in the digital path for additional aliasing rejection. However, after a certain interval or after the jammer (or other particular signal) is no longer detected, the controller may configure the pipelined ADC circuit 900 to bypass or downgrade the filtering rejection of the digital filter 910.

When the digital filter 910 is present, the digital filter 910 may further filter the initial stage digital filtered signal ($d_h$) to generate an initial stage further filtered digital signal (labeled "$d_g$"). Then, the digital downsampler 912 may downsample the initial stage further filtered digital signal ($d_g$) to generate the initial stage downsampled digital signal ($d_m$) with lowered frequency content (e.g., more compatible with $f_s$).

With the pipelined ADC circuit 900 as described above, higher sampling rates ($Mf_s$) may be used by the initial stage 901, such that folding back of unwanted signals (having frequencies between $f_s/2$ and $f_s$ for M=2) into the band of interest is avoided. Furthermore, filtering for alias rejection is performed in both the analog and digital domains at the output of the initial stage 901 (e.g., by the analog filter 904 and the digital filter 908). Further alias filtering can be performed in the digital domain using optional digital filter 910.

Moreover, in two-stage pipelined ADC circuits such as the ADC circuit 900, the inter-stage amplifier (e.g., amplifier 858) may be the most challenging part of the design. Certain aspects of the present disclosure allow the amplifier to operate at a lower rate than the rest of the stage, since the amplifier may be preceded by an analog downsampler.

The last stage 902 may include an ADC 914 having an input coupled to an output of the amplifier 858 of the previous stage (e.g., the initial stage 901). The ADC 914 may be implemented as a SAR ADC, a flash ADC, or any other suitable type of ADC. The ADC 914 may receive the initial stage output analog signal (e.g., the amplified residue signal ($v_o$) from the amplifier 858) as a last stage input analog signal. The ADC 914 may convert the received analog signal to a last stage digital signal (e.g., the digitized residue, but labeled here as a Stage 2 output $d_2$) at the sampling rate ($f_s$) of the pipelined ADC circuit. In this manner, the latter stages of the pipelined ADC circuit do not waste power operating at higher sampling rates.

The initial stage downsampled digital signal $d_m$ may function as the digital output signal for the initial stage 901. Both the digital signal $d_m$ and the digital signal $d_2$ are sent to the decoder 804 for bit combining and generating the output digital signal $d_{out}$ from the pipelined ADC circuit, as described above.

Figure 9B:
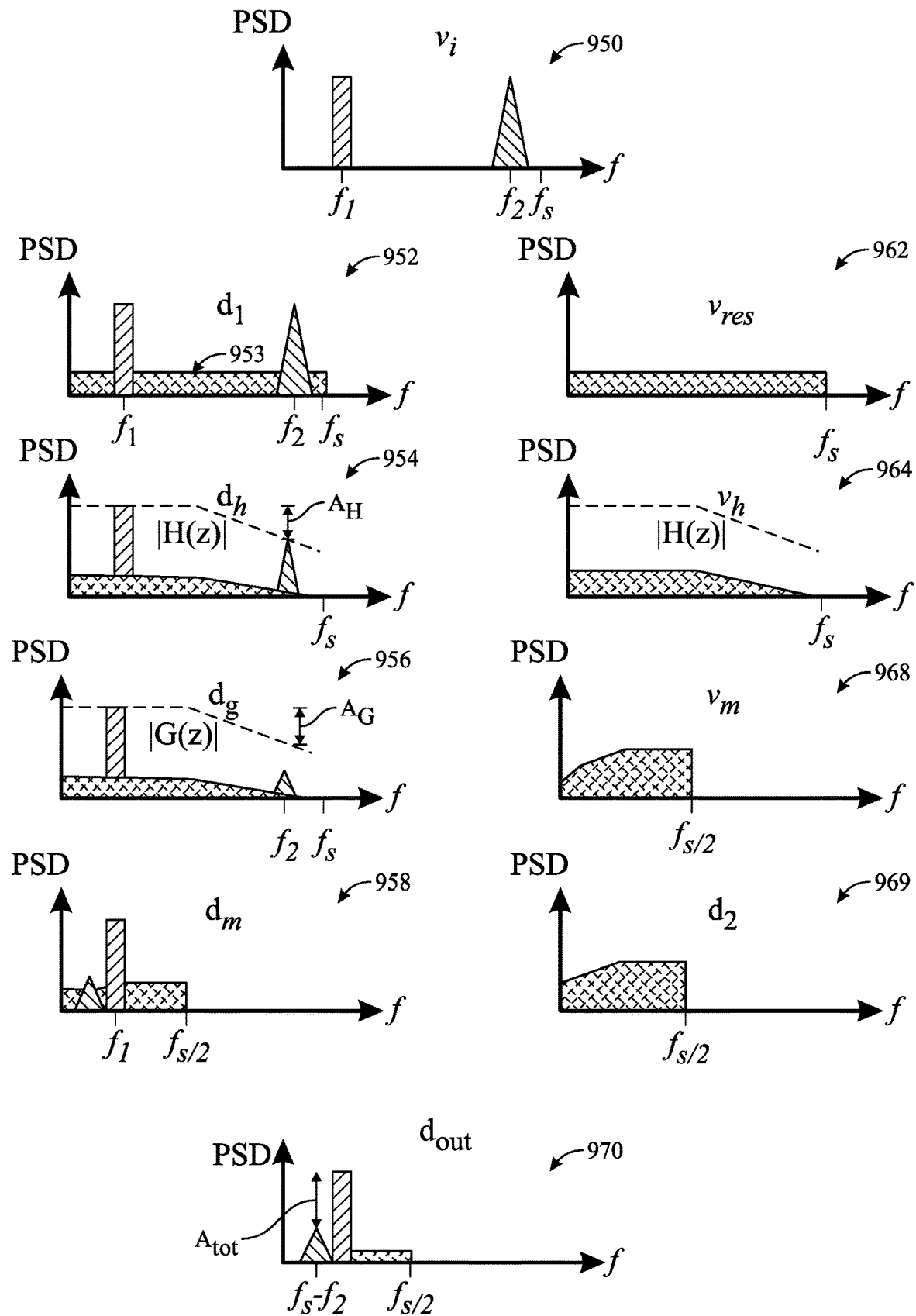
FIG. 9B provides example power spectrums at various nodes in the pipelined ADC circuit of FIG. 9A for an example input signal having both desired and unwanted frequencies, in accordance with certain aspects of the present disclosure.

FIG. 9B provides example power spectrums at various nodes in the pipelined ADC circuit 900 of FIG. 9A, illustrating power spectral density (PSD) versus frequency. In this example, the initial stage 901 is running at $2f_s$ (i.e., M=2), and the last stage 902 is running at $f_s$.

A power spectrum 950 for the analog input signal ($v_i$) illustrates the input signal having a desired frequency $f_1$ (or a frequency range centered around or including frequency $f_1$) and an unwanted frequency $f_2$ (or a frequency range centered around or including frequency $f_2$) for M=2. After sampling (e.g., by the switch 903) and conversion by the ADC 852 at the higher sampling rate ($Mf_s$) of the initial stage input analog signal, the power spectrum 952 for the initial stage digital signal ($d_i$) illustrates content at both the desired and unwanted frequencies, but without aliasing of the unwanted frequency $f_2$. Sampling and conversion also introduces some level of noise 953 into the power spectrum 952. In other words, because the unwanted frequency $f_2$ is lower than the Nyquist frequency of the ADC 852, there was no folding back of the unwanted frequency.

After low-pass filtering of the initial stage digital signal ($d_i$) by the digital filter 908 with transfer function H(z), the power spectrum 954 for the initial stage filtered digital signal ($d_h$) illustrates a reduction (labeled "$A_H$") in the power of the unwanted frequency $f_2$. In this example, the initial stage filtered digital signal ($d_h$) is further low-pass filtered by the digital filter 910 with transfer function G(z), and the power spectrum 956 for the resulting initial stage further filtered digital signal ($d_g$) illustrates a further reduction (labeled "$A_G$") in the power of the unwanted frequency $f_2$, such that the total reduction (labeled "$A_{tot}$") in the power of the unwanted frequency $f_2$ is the sum of the two reductions (i.e., $A_{tot}=A_H+A_G$, as illustrated in the power spectrum 970).

The digital downsampler 912 may digitally downsample the initial stage further filtered digital signal ($d_g$) to generate the initial stage downsampled digital signal ($d_m$). The power spectrum 958 for the initial stage downsampled digital signal ($d_m$) illustrates aliasing of frequencies above the downsampler's effective Nyquist frequency (here, $f_s/2$), such that the content at the unwanted frequency $f_2$ folds back into the band of interest near the desired frequency $f_1$ (namely, at $f_s-f_2$), but with much lower power compared to the power spectrum 952. As shown in the example power spectrum 958, the aliased undesired content is not significantly higher than the noise floor.

As for the analog path in the initial stage 901, the power spectrum 962 for the initial stage residue signal ($v_{res}$) illustrates the difference between the initial stage input analog signal ($v_i$) and the initial stage intermediary analog signal ($v_i^*$) output by the DAC 854, leaving what appears to be the noise 953. This noise in the power spectrum 962 represents the quantization error of the initial stage 901, whose PSD is approximated by flat noise in FIG. 9B. After low-pass filtering of the initial stage residue signal ($v_{res}$) by the analog filter 904 with transfer function H(z), the power spectrum 964 for the initial stage filtered analog signal ($v_h$) illustrates a reduction in the power of higher frequencies.

The analog downsampler 906 may downsample the initial stage filtered analog signal ($v_h$) to generate the initial stage downsampled analog signal ($v_m$). The power spectrum 968 for the initial stage downsampled digital signal ($d_m$) illustrates aliasing of frequencies above the downsampler's effective Nyquist frequency (here, $f_s/2$), such that the frequency content is folded back into the band of interest. The last stage 902 may quantize the initial stage downsampled analog signal ($v_m$) to generate the last stage digital signal ($d_2$), with the power spectrum 969 for the last stage digital signal ($d_2$) having a similar shape as the power spectrum 968. The quantization error of the last stage 902 is not shown.

After the decoder 804 combines the initial stage downsampled digital signal ($d_m$) and the last stage digital signal ($d_2$), the power spectrum 970 for the output digital signal $d_{out}$ illustrates a high signal-to-noise ratio (SNR) for the desired frequency $f_1$. Some quantization noise may remain at higher frequencies, as shown in the power spectrum 970. This may be due, for example, to mismatch between the alias filtering in the analog and digital paths of the pipelined ADC circuit (e.g., the different attenuation of the analog and digital filters at higher frequencies).

Figure 10:
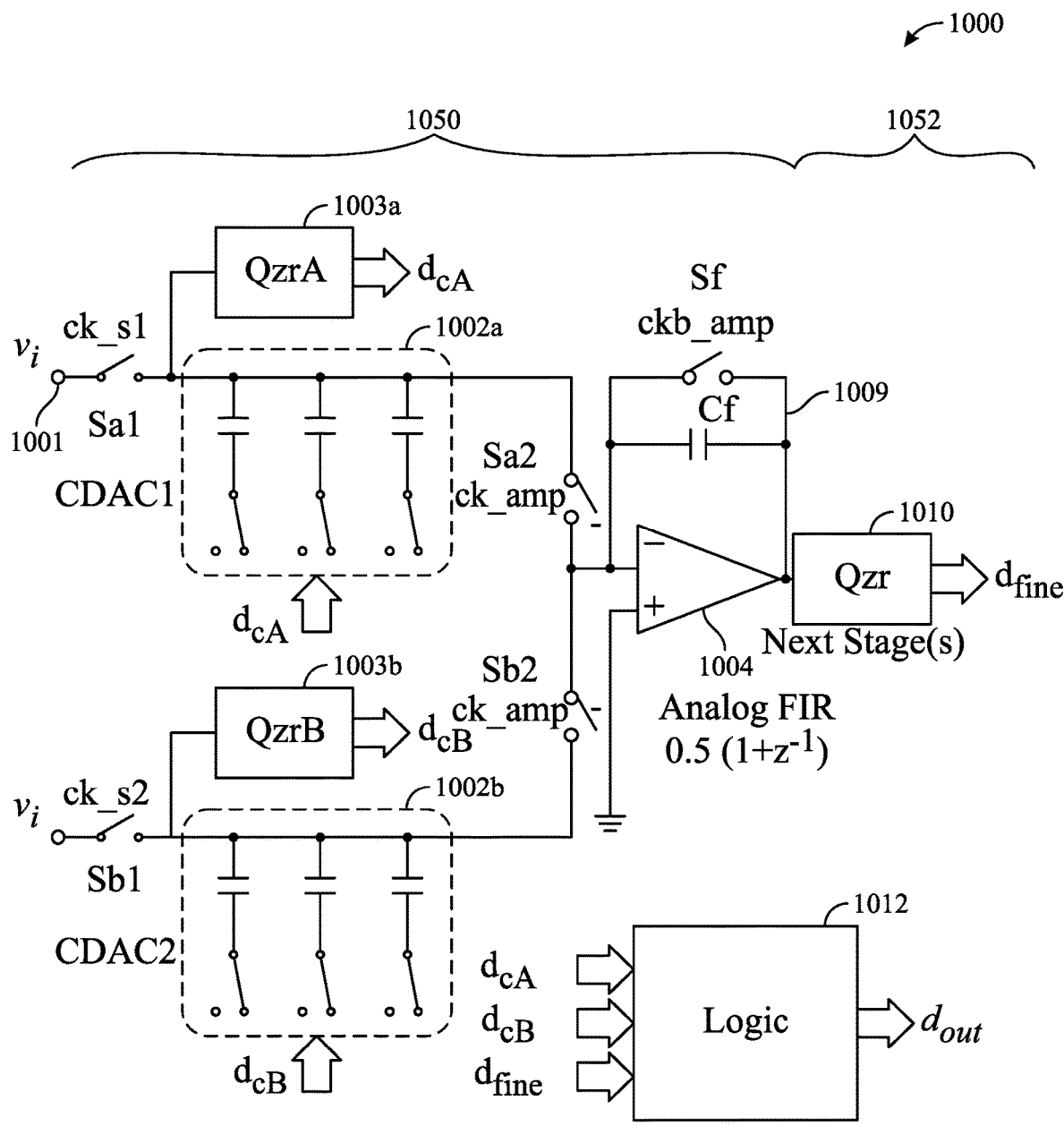
FIG. 10 is a block diagram of an example implementation of the pipelined ADC circuit of FIG. 9A, in accordance with certain aspects of the present disclosure.

FIG. 10 is a block diagram of an example pipelined ADC circuit 1000 implementing the pipelined ADC circuit 900 of FIG. 9A, in accordance with certain aspects of the present disclosure. The pipelined ADC circuit 1000 incorporates aspects of both the SAR ADC and pipelined ADC circuits described above, with an analog FIR filter implemented in the first stage to reduce aliasing. Although the pipelined ADC circuit 1000 is illustrated in FIG. 10 as single-ended implementation, it is to be understood that the pipelined ADC circuit 1000 may be implemented as a fully differential circuit.

As illustrated in FIG. 10, the pipelined ADC circuit 1000 includes a first stage 1050, a second stage 1052, and logic 1012. However, it is to be understood that the pipelined ADC circuit may include more than two stages.

As shown, the first stage 1050 of the pipelined ADC circuit 1000 includes a pair of sample-and-hold switches Sa1 and Sb1 (also referred to herein as a "first set of switches"), a pair of CDACs 1002a and 1002b (collectively referred to herein as "CDACs 1002"), a pair of quantizers 1003a and 1003b (collectively referred to herein as "quantizers 1003") for coarse quantization, a pair of amplification switches Sa2 and Sb2 (also referred to herein as a "second set of switches"), an amplifier 1004, a feedback capacitive element Cf, and a reset switch Sf. Each of the CDACs 1002 may include a switched array of binary-weighted capacitors, for example. Each of the sample-and-hold switches Sa1 and Sb1 may be controlled by a respective sample clock signal ck_s1 and ck_s2. Furthermore, each of the sample-and-hold switches Sa1 and Sb1 may be coupled between an input node 1001 of the pipelined ADC circuit 1000 and an output of a corresponding CDAC, which is also coupled to an input of a corresponding quantizer. For example, switch Sa1 is coupled at one end to CDAC 1002a (labeled "CDAC1") and to quantizer 1003a (labeled "QzrA"), and switch Sb1 is coupled at one end to CDAC 1002b (labeled "CDAC2") and to quantizer 1003b (labeled "QzrB").

The quantizers 1003 may be analogous to the ADC 852 of FIG. 9A or the quantizers 603 of FIG. 6 and may operate at a higher sampling rate ($Mf_s$, such as at $2f_s$) than the sampling rate ($f_s$) of the pipelined ADC circuit 1000. Thus, each of the quantizers 1003 of FIG. 10 may be implemented, for example, by a flash ADC, a SAR ADC, or any other suitable type of ADC. Each of the quantizers 1003 has a respective coarse digital output $d_{cA}$ or $d_{cB}$, which is coupled to the inputs of a respective CDAC. Thus, the CDACs 1002 may be analogous to the DAC 854 of FIG. 9A.

The outputs of the CDACs 1002 may be coupled to a negative input of the amplifier 1004 via the amplification switches, which may be controlled via a control signal ck_amp. As shown in FIG. 10, switch Sa2 may be coupled between the output of CDAC 1002a and the negative input of the amplifier 1004, and switch Sb2 may be coupled between the output of CDAC 1002b and the negative input of the amplifier 1004. The amplifier 1004 may be analogous to an inter-stage amplifier of a pipelined ADC circuit (e.g., to amplifier 858 of FIG. 9A) and may provide a certain gain. The positive input of the amplifier 1004 may be coupled to a reference potential node (e.g., electrical ground) for the pipelined ADC circuit 1000. The feedback capacitive element Cf may be coupled between an output of the amplifier at node 1009 and the negative input of the amplifier, and the reset switch Sf may be coupled in parallel with the feedback capacitive element Cf. The reset switch Sf may be controlled by a control signal ckb_amp that is complementary to the control signal ck_amp for the switches Sa2 and Sb2. In other words, the reset switch Sf may be closed to discharge the feedback capacitive element Cf when the switches Sa2 and Sb2 are open, and the reset switch Sf may be open to allow charging of the feedback capacitive element Cf when the switches Sa2 and Sb2 are closed.

The second stage 1052 includes a quantizer 1010, which may represent one or more latter stages of a pipelined ADC, for example, and may be analogous to ADC 914 of FIG. 9A. Thus, the quantizer 1010 may be implemented as a SAR ADC, a flash ADC, or any other suitable type of ADC. The quantizer 1010 may be coupled to the output of the amplifier 1004 at node 1009 and receive the first stage output analog signal (e.g., from the amplifier 1004) as a last stage input analog signal. The quantizer 1010 may convert the received analog signal to a last stage digital signal (e.g., the digitized residue, labeled here as "$d_{fine}$") at the sampling rate ($f_s$) of the pipelined ADC circuit 1000. In this manner, the latter stage(s) of the pipelined ADC circuit do not waste power operating at higher sampling rates.

The logic 1012 may be analogous to the decoder 804 of FIGS. 8A and 9A. The logic 1012 may receive the coarse quantizations $d_{cA}$ and $d_{cB}$ from the quantizers 1003a and 1003b, respectively, and the fine quantization $d_{fine}$ from the quantizer 1010 and combine these to produce the digital output signal $d_{out}$. For certain aspects, the logic 1012 may implement additional digital signal processing, such as digital filtering (e.g., similar to the digital filter 908 and/or the digital filter 910 of FIG. 9A) for the coarse quantizations $d_{cA}$ and $d_{cB}$.

During operation of the pipelined ADC circuit 1000, the sample clock signals ck_s1 and ck_s2 may be operated—according to the higher sampling rate of the first stage 1050—to consecutively sample the analog input signal ($v_i$) at input node 1001 and charge the capacitors of the CDACs 1002 (e.g., CDAC1 with charge Q1 and CDAC2 with charge Q2). When it is time to amplify the samples with amplifier 1004, the switches Sa2 and Sb2 may be closed (via ck_amp), and the reset switch Sf may be opened (via ckb_amp), charging the feedback capacitive element Cf with charge Qf, which is a proportional version of charges Q1 and Q2 (i.e., the amplifier output α(Q1+Q2)). With the two consecutive samples ($V_k$ and $V_{k-1}$, similar to the SAR ADC circuit 600 of FIG. 6), the output may thus be proportional to $C(V_k+V_{k-1})$, where C is the capacitance value of the feedback capacitive element Cf. This is approximately equivalent to having a FIR filter with a transfer function $H(z)=(1+z^{-1})/2$, which is a low-pass filter with unity gain at low frequencies and attenuation at the sampling rate of the pipelined ADC circuit 1000. In this manner, the pipelined ADC circuit 1000 may implement some of the functionality of the circuits described above, using an internal 2-tap FIR filter operating at a higher sampling rate in the first stage 1050 for alias rejection.

With the pipelined ADC circuits described herein, only a portion of the ADC circuit (e.g., the initial stage(s)) is operated at a higher rate for alias rejection, thereby saving power compared to implementations where all stages are operated at the higher rate.

Example Conversion Operations

Figure 11:
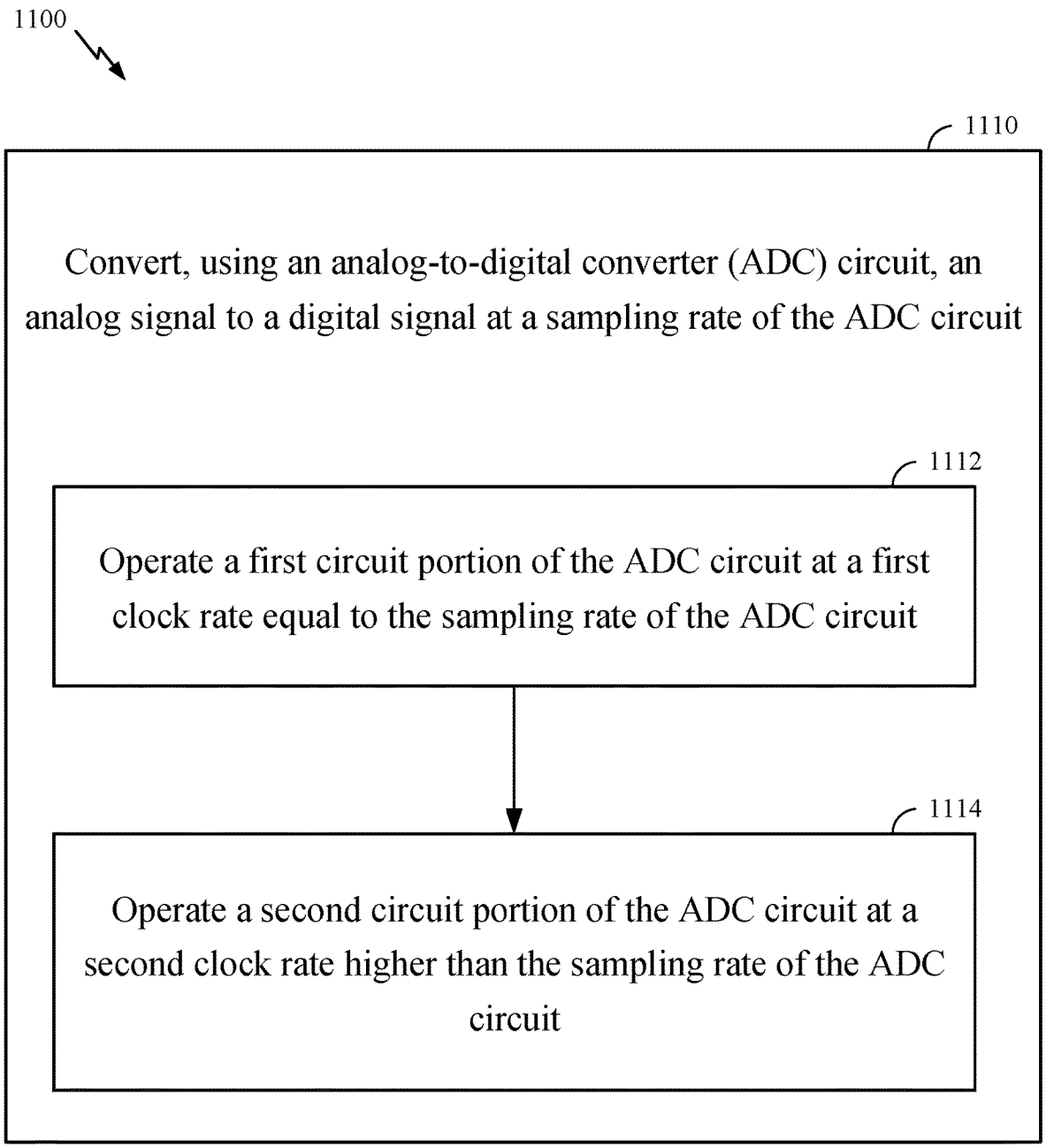
FIG. 11 is a flow diagram depicting example operations for signal conversion, in accordance with certain aspects of the present disclosure.

FIG. 11 is a flow diagram depicting example operations 1100 for signal conversion, in accordance with certain aspects of the present disclosure. The operations 1100 may be performed by an ADC circuit (e.g., the SAR ADC circuit 300 of FIG. 3, the SAR ADC circuit 600 of FIG. 6, the pipelined ADC circuit 900 of FIG. 9A, or the ADC circuit 1000 of FIG. 10).

The operations 1100 may include the ADC circuit converting an analog signal to a digital signal at a sampling rate (e.g., $f_s$) of the ADC circuit at block 1110. The converting at block 1110 may include operating a first circuit portion of the ADC circuit at a first clock rate equal to the sampling rate of the ADC circuit at block 1112 and operating a second circuit portion of the ADC circuit at a second clock rate (e.g., $2f_s$ or $Mf_s$) at block 1114. The second clock rate is higher than the sampling rate of the ADC circuit. For example, the second clock rate may be greater than or equal to two times the sampling rate of the ADC circuit. In another example, the second clock rate may be between one and two times the sampling rate of the ADC circuit.

According to certain aspects, operating the second circuit portion at block 1114 may involve operating an analog finite impulse response (FIR) filter (e.g., the multi-input comparator 400 with weighted transistors or the 2-tap FIR filter with transfer function $H(z)=(1+z^{-1})/2$) in the second circuit portion of the ADC circuit at the second clock rate.

According to certain aspects, the ADC circuit is a pipelined ADC (e.g., the pipelined ADC circuit 900) having a plurality of stages (e.g., stages 802, 850, 901, and/or 902). In this case, the second circuit portion may include one or more initial stages (e.g., initial stage 901) in the plurality of stages of the pipelined ADC, and the first circuit portion may include one or more latter stages (e.g., stage 850 or the last stage 902) in the plurality of stages of the pipelined ADC. For certain aspects, one of the initial stages includes an ADC (e.g., ADC 852), a digital-to-analog converter (DAC) (e.g., DAC 854), a combiner (e.g., combiner 856), an analog filter (e.g., analog filter 904), and a first digital filter (e.g., digital filter 908). In this case, operating the second circuit portion may involve: operating the ADC at the second clock rate to convert a stage input analog signal (e.g., signal $v_i$) to a stage digital signal (e.g., signal $d_j$); operating the DAC at the second clock rate to convert the stage digital signal to a stage intermediary analog signal (e.g., signal $v_i^*$); determining, using the combiner, a stage residue signal (e.g., signal $v_{res}$) based on a difference between the stage input analog signal and the stage intermediary analog signal; filtering the stage residue signal with the analog filter to generate a stage filtered residue signal (e.g., signal $v_h$); and filtering the stage digital signal with the first digital filter to generate a stage filtered digital signal (e.g., signal $d_h$). For certain aspects, operating the second circuit portion further involves: downsampling the stage filtered residue signal to generate a stage downsampled residue signal (e.g., signal $v_m$); amplifying the stage downsampled residue signal to generate a stage amplified residue signal (e.g., signal $v_o$) for outputting to a subsequent stage (e.g., one of stages 802b to 802n, stage 850, the last stage 902) in the pipelined ADC; and downsampling the stage filtered digital signal to generate a stage downsampled digital signal (e.g., signal $d_m$). In this case, the converting at block 1110 may further include combining the stage downsampled digital signal from the one of the initial stages with at least one or more stage digital signals (e.g., signal $d_2$) from the one or more latter stages to generate the digital signal (e.g., signal $d_{out}$) for outputting from the ADC circuit. A transfer function of the analog filter (e.g., $H(z)$) may be the same or at least similar to a transfer function of the first digital filter (e.g., $H(z)$).

For certain aspects, the one of the initial stages further includes a second digital filter (e.g., digital filter 910). In this case, operating the second circuit portion at block 1114 may further involve filtering the stage filtered digital signal with the second digital filter to generate a stage further filtered digital signal (e.g., signal $d_g$). For certain aspects, the operations 1100 may further include programming the second digital filter before filtering with the second digital filter. The second digital filter may have a higher order (i.e., may be a higher-order filter) than the first digital filter. In another case, operating the second circuit portion at block 1114 may involve bypassing the second digital filter.

According to certain aspects, one of the initial stages includes: an amplifier (e.g., amplifier 1004) having an output coupled to an output of the one of the initial stages; a feedback capacitive element (e.g., feedback capacitive element Cf) coupled between the output of the amplifier and an input of the amplifier; a first set of switches (e.g., switches Sa1 and Sb1); a second set of switches (e.g., switches Sa2 and Sb2); a plurality of capacitive digital-to-analog converters (CDACs) (e.g., CDACs 1002) having outputs selectively coupled to an input (e.g., input node 1001) of the one of the initial stages via the first set of switches and selectively coupled to an input of the amplifier via the second set of switches; and a plurality of quantizers (e.g., quantizers 1003) having inputs coupled to the outputs of the plurality of CDACs and selectively coupled to the input of the one of the initial stages via the first set of switches and having outputs coupled to inputs of the plurality of CDACs. In this case, operating the second circuit portion at block 1114 may involve: sequentially sampling the analog signal using the first set of switches according to the second clock rate; sequentially converting the sampled analog signal to a plurality of coarse digital signals (e.g., $d_{cA}$ and $d_{cB}$) using the plurality of quantizers according to the second clock rate; controlling inputs of the plurality of CDACs using the plurality of coarse digital signals; closing the second set of switches to couple remaining portions of the sampled analog signal on the plurality of CDACs to the input of the amplifier; and applying a finite impulse response (FIR) filter to the remaining portions of the sampled analog signal using the amplifier and the feedback capacitive element.

According to certain aspects, the ADC circuit comprises a successive-approximation register (SAR) ADC (e.g., the SAR ADC circuit 300) having a plurality of capacitive digital-to-analog converters (CDACs) (e.g., CDACs 302)

and a multi-input comparator (e.g., the multi-input comparator 304). The multi-input comparator may have a plurality of inputs coupled to outputs of the plurality of CDACs. In this case, the second circuit portion may include the plurality of CDACs, and the first circuit portion may include the multi-input comparator. For example, the plurality of CDACs may operate at $Mf_s$ (altogether processing multiple input samples in every $1/f_s$ time interval), whereas the multi-input comparator (and associated logic) may produce one output in every $1/f_s$ interval. For certain aspects, the plurality of inputs of the multi-input comparator may have different weights (see, e.g., transistors M3 and M4 of FIG. 4). If so, operating the first circuit portion at block 1112 may involve effectively applying a finite impulse response (FIR) filter, based on the different weights, to a plurality of sampled input signals received by the plurality of inputs of the multi-input comparator. For certain aspects, the converting at block 1110 may further involve controlling the plurality of CDACs based on the digital signal (e.g., $d_{out}$) during the conversion.

In the case of a SAR ADC, operating the second circuit portion at block 1114 may involve cycling through a plurality of switches (e.g., sample-and-hold switches S1, S2, ..., Sm) at the second clock rate, one of the plurality of switches per clock pulse at the second clock rate, where the plurality of switches are coupled to outputs of the plurality of CDACs. Thus, the digital signal may be a linear weighted combination of different samples in the time domain of the analog signal, based on the operation of the plurality of switches.

In the case of a SAR ADC, operating the second circuit portion at block 1114 may involve sequentially sampling the analog signal using a plurality of switches (e.g., sample-and-hold switches S1, S2, ..., Sm) coupled to outputs of the plurality of CDACs, according to the second clock rate. For certain aspects, operating the first circuit portion at block 1112 includes: converting the sampled analog signals on the plurality of CDACs using the multi-input comparator and SAR logic (e.g., SAR logic 306) to generate the digital signal (e.g., $d_{out}$) at the first clock rate; and controlling inputs of the plurality of CDACs using the digital signal during the converting of the sampled analog signals. For certain aspects, at least one of the plurality of CDACs is inoperable during the sequentially sampling.

According to certain aspects, operating the second circuit portion at block 1114 involves: sequentially sampling the analog signal using a plurality of switches e.g., sample-and-hold switches S1, S2, ..., Sm) according to the second clock rate, the plurality of switches being coupled to outputs of the CDACs; sequentially converting the sampled analog signal to a plurality of coarse digital signals (e.g., coarse quantizations $d_{c1}$, $d_{c2}$, ..., $d_{cm}$) using a plurality of quantizers (e.g., quantizers 603) according to the second clock rate; and controlling higher significant bit inputs of the plurality of CDACs using the plurality of coarse digital signals. In this case, operating the first circuit portion at block 1112 may involve: converting remaining portions of the sampled analog signal on the plurality of CDACs using the multi-input comparator and SAR logic (e.g., SAR logic 606) to generate a fine digital signal (e.g., fine quantization $d_{fine}$) at the first clock rate; and controlling lower significant bit inputs of the plurality of CDACs using the fine digital signal.

Example Aspects

Implementation examples are described in the following numbered aspects:

Aspect 1: An analog-to-digital converter (ADC) circuit comprising: a first circuit portion configured to operate at a first clock rate equal to a sampling rate of the ADC circuit; and a second circuit portion configured to operate at a second clock rate higher than the sampling rate of the ADC circuit.

Aspect 2: The ADC circuit of Aspect 1, wherein the second circuit portion comprises an analog finite impulse response (FIR) filter operated at the second clock rate.

Aspect 3: The ADC circuit of Aspect 1 or 2, wherein the ADC circuit comprises a pipelined ADC having a plurality of stages, wherein the second circuit portion comprises one or more initial stages in the plurality of stages of the pipelined ADC and wherein the first circuit portion comprises one or more latter stages in the plurality of stages of the pipelined ADC.

Aspect 4: The ADC circuit of Aspect 3, wherein one of the initial stages comprises: an ADC configured to be operated at the second clock rate; a digital-to-analog converter (DAC) configured to be operated at the second clock rate and having an input coupled to an output of the ADC; a combiner having a first input coupled to an input of the ADC and having a second input coupled to an output of the DAC; an analog filter having an input coupled to an output of the combiner; and a first digital filter having an input coupled to an output of the ADC.

Aspect 5: The ADC circuit of Aspect 4, wherein the one of the initial stages further comprises: an analog downsampler having an input coupled to an output of the analog filter; and a digital downsampler having an input coupled to an output of the first digital filter.

Aspect 6: The ADC circuit of Aspect 5, wherein: the pipelined ADC further comprises a decoder coupled to outputs of the plurality of stages; the one of the initial stages further comprises an amplifier having an input coupled to an output of the analog downsampler and having an output coupled to a subsequent stage in the plurality of stages; and an output of the digital downsampler is coupled to the decoder.

Aspect 7: The ADC circuit of any of Aspects 4 to 6, wherein a transfer function of the analog filter is similar to a transfer function of the first digital filter.

Aspect 8: The ADC circuit of any of Aspects 4 to 7, wherein the one of the initial stages further comprises a second digital filter having an input coupled to an output of the first digital filter.

Aspect 9: The ADC circuit of Aspect 8, wherein the second digital filter is programmable.

Aspect 10: The ADC circuit of Aspect 8 or 9, wherein the second digital filter can be bypassed or can effectively have a unity transfer function.

Aspect 11: The ADC circuit of any of Aspects 8-10, wherein the second digital filter has a higher order than the first digital filter.

Aspect 12. The ADC circuit of any of Aspects 8 to 11, wherein the one of the initial stages further comprises: an analog downsampler having an input coupled to an output of the analog filter; an amplifier having an input coupled to an output of the analog downsampler; and a digital downsampler having an input coupled to an output of the second digital filter, wherein an output of the amplifier is coupled to an analog output of the one of the initial stages and wherein an output of the digital downsampler is coupled to a digital output of the one of the initial stages.

Aspect 13: The ADC circuit of Aspect 3, wherein one of the initial stages comprises: an amplifier having an output coupled to an output of the one of the initial stages; a feedback capacitive element coupled between the output of the amplifier and an input of the amplifier; a first set of switches; a second set of switches; a plurality of capacitive digital-to-analog converters (CDACs) having outputs selectively coupled to an input of the one of the initial stages via the first set of switches and selectively coupled to an input of the amplifier via the second set of switches; and a plurality of quantizers having inputs coupled to the outputs of the plurality of CDACs and selectively coupled to the input of the one of the initial stages via the first set of switches and having outputs coupled to inputs of the plurality of CDACs.

Aspect 14: The ADC circuit of Aspect 13, wherein the one of the initial stages further comprises a switch coupled in parallel with the feedback capacitive element.

Aspect 15: The ADC circuit of any of Aspects 1 to 12, wherein: the ADC circuit comprises a successive-approximation register (SAR) ADC having a plurality of capacitive digital-to-analog converters (CDACs) and a multi-input comparator, the multi-input comparator having a plurality of inputs coupled to outputs of the plurality of CDACs; the second circuit portion comprises the plurality of CDACs; and the first circuit portion comprises the multi-input comparator.

Aspect 16: The ADC circuit of Aspect 15, wherein the plurality of inputs of the multi-input comparator have different weights, the different weights being implemented by different sizes of input transistors in the multi-input comparator.

Aspect 17: The ADC circuit of Aspect 15 or 16, wherein the SAR ADC further comprises logic having an input coupled to an output of the multi-input comparator, having an output coupled to inputs of the plurality of CDACs, and configured to produce a digital output signal at the output of the logic according to the sampling rate of the ADC circuit.

Aspect 18: The ADC circuit of Aspect 17, wherein the digital output signal is a linear weighted combination of different samples in the time domain of an input voltage signal at an input of the SAR ADC, based on an operation of a plurality of switches coupled to outputs of the plurality of CDACs and configured to be cycled through at the second clock rate, one of the plurality of switches per clock pulse at the second clock rate.

Aspect 19: The ADC circuit of Aspect 15 or 16, wherein outputs of the plurality of CDACs are selectively coupled to an input of the SAR ADC via a plurality of switches configured to be cycled through at the second clock rate, one of the plurality of switches per clock pulse at the second clock rate.

Aspect 20: The ADC circuit of Aspect 19, wherein the SAR ADC further comprises a plurality of quantizers having inputs selectively coupled to the input of the SAR ADC via the plurality of switches and having outputs coupled to higher significant bit inputs of the plurality of CDACs.

Aspect 21: The ADC circuit of Aspect 20, wherein the SAR ADC further comprises logic having an input coupled to an output of the multi-input comparator, having a first output coupled to lower significant bit inputs of the plurality of CDACs, and configured to produce a digital output signal at a second output of the logic according to the sampling rate of the ADC circuit, the digital output signal being a weighted addition of a coarse quantization from one of the plurality of quantizers and a fine quantization based on an output signal from the multi-input comparator.

Aspect 22: The ADC circuit of any of the preceding Aspects, wherein the second clock rate is two times the sampling rate of the ADC circuit.

Aspect 23: A method of signal conversion, the method comprising converting, using an analog-to-digital converter (ADC) circuit, an analog signal to a digital signal at a sampling rate of the ADC circuit, wherein the converting comprises: operating a first circuit portion of the ADC circuit at a first clock rate equal to the sampling rate of the ADC circuit; and operating a second circuit portion of the ADC circuit at a second clock rate higher than the sampling rate of the ADC circuit.

Aspect 24: The method of Aspect 23, wherein operating the second circuit portion comprises operating an analog finite impulse response (FIR) filter in the second circuit portion of the ADC circuit at the second clock rate.

Aspect 25: The method of Aspect 23 or 24, wherein the ADC circuit comprises a pipelined ADC having a plurality of stages, wherein the second circuit portion comprises one or more initial stages in the plurality of stages of the pipelined ADC, and wherein the first circuit portion comprises one or more latter stages in the plurality of stages of the pipelined ADC.

Aspect 26: The method of Aspect 25, wherein: one of the initial stages comprises an ADC, a digital-to-analog converter (DAC), a combiner, an analog filter, and a first digital filter; and operating the second circuit portion comprises: operating the ADC at the second clock rate to convert a stage input analog signal to a stage digital signal; operating the DAC at the second clock rate to convert the stage digital signal to a stage intermediary analog signal; determining, using the combiner, a stage residue signal based on a difference between the stage input analog signal and the stage intermediary analog signal; filtering the stage residue signal with the analog filter to generate a stage filtered residue signal; and filtering the stage digital signal with the first digital filter to generate a stage filtered digital signal.

Aspect 27: The method of Aspect 26, wherein: operating the second circuit portion further comprises: downsampling the stage filtered residue signal to generate a stage downsampled residue signal; amplifying the stage downsampled residue signal to generate a stage amplified residue signal for outputting to a subsequent stage in the pipelined ADC; and downsampling the stage filtered digital signal to generate a stage downsampled digital signal; and the converting further comprises combining the stage downsampled digital signal from the one of the initial stages with at least one or more stage digital signals from the one or more latter stages to generate the digital signal for outputting from the ADC circuit.

Aspect 28: The method of Aspect 26 or 27, wherein a transfer function of the analog filter is similar to a transfer function of the first digital filter.

Aspect 29: The method of any of Aspects 26 to 28, wherein the one of the initial stages further comprises a second digital filter and wherein operating the second circuit portion further comprises filtering the stage filtered digital signal with the second digital filter to generate a stage further filtered digital signal.

Aspect 30: The method of Aspect 29, further comprising programming the second digital filter before filtering with the second digital filter.

Aspect 31: The method of Aspect 29 or 30, wherein the second digital filter has a higher order than the first digital filter.

Aspect 32: The method of any of Aspects 26 to 28, wherein the one of the initial stages further comprises a second digital filter and wherein operating the second circuit portion further comprises bypassing the second digital filter.

Aspect 33: The method of Aspect 25, wherein: one of the initial stages comprises: an amplifier having an output coupled to an output of the one of the initial stages; a feedback capacitive element coupled between the output of the amplifier and an input of the amplifier; a first set of switches; a second set of switches; a plurality of capacitive digital-to-analog converters (CDACs) having outputs selectively coupled to an input of the one of the initial stages via the first set of switches and selectively coupled to an input of the amplifier via the second set of switches; and a plurality of quantizers having inputs coupled to the outputs of the plurality of CDACs and selectively coupled to the input of the one of the initial stages via the first set of switches and having outputs coupled to inputs of the plurality of CDACs; and operating the second circuit portion comprises: sequentially sampling the analog signal using the first set of switches according to the second clock rate; sequentially converting the sampled analog signal to a plurality of coarse digital signals using the plurality of quantizers according to the second clock rate; controlling inputs of the plurality of CDACs using the plurality of coarse digital signals; closing the second set of switches to couple remaining portions of the sampled analog signal on the plurality of CDACs to the input of the amplifier; and applying a finite impulse response (FIR) filter to the remaining portions of the sampled analog signal using the amplifier and the feedback capacitive element.

Aspect 34: The method of any of Aspects 23 to 33, wherein: the ADC circuit comprises a successive-approximation register (SAR) ADC having a plurality of capacitive digital-to-analog converters (CDACs) and a multi-input comparator, the multi-input comparator having a plurality of inputs coupled to outputs of the plurality of CDACs; the second circuit portion comprises the plurality of CDACs; and the first circuit portion comprises the multi-input comparator.

Aspect 35: The method of Aspect 34, wherein the plurality of inputs of the multi-input comparator have different weights and wherein operating the first circuit portion comprises effectively applying a finite impulse response (FIR) filter, based on the different weights, to a plurality of sampled input signals received by the plurality of inputs of the multi-input comparator.

Aspect 36: The method of Aspect 34 or 35, wherein the converting further comprises controlling the plurality of CDACs based on the digital signal during the conversion.

Aspect 37: The method of any of Aspects 34 to 36, wherein: operating the second circuit portion comprises cycling through a plurality of switches at the second clock rate, one of the plurality of switches per clock pulse at the second clock rate; the plurality of switches are coupled to outputs of the plurality of CDACs; and the digital signal is a linear weighted combination of different samples in the time domain of the analog signal, based on the operation of the plurality of switches.

Aspect 38: The method of Aspect 34, wherein: operating the second circuit portion comprises sequentially sampling the analog signal using a plurality of switches coupled to outputs of the plurality of CDACs, according to the second clock rate; and operating the first circuit portion comprises: converting the sampled analog signals on the plurality of CDACs using the multi-input comparator and SAR logic to generate the digital signal at the first clock rate; and controlling inputs of the plurality of CDACs using the digital signal during the converting of the sampled analog signals.

Aspect 39: The method of Aspect 38, wherein during the sequentially sampling, at least one of the plurality of CDACs is inoperable.

Aspect 40: The method of Aspect 34, wherein: operating the second circuit portion comprises: sequentially sampling the analog signal using a plurality of switches according to the second clock rate, the plurality of switches being coupled to outputs of the CDACs; sequentially converting the sampled analog signal to a plurality of coarse digital signals using a plurality of quantizers according to the second clock rate; and controlling higher significant bit inputs of the plurality of CDACs using the plurality of coarse digital signals; and operating the first circuit portion comprises: converting remaining portions of the sampled analog signal on the plurality of CDACs using the multi-input comparator and SAR logic to generate a fine digital signal at the first clock rate; and controlling lower significant bit inputs of the plurality of CDACs using the fine digital signal.

Aspect 41: The method of Aspect 40, wherein the multi-input comparator is used to digitize the sampled analog signal for at least some initial conversions.

Aspect 42: The method of any of Aspects 23 to 41, wherein the second clock rate is more than two times the sampling rate of the ADC circuit.

ADDITIONAL CONSIDERATIONS

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. An analog-to-digital converter (ADC) circuit comprising:
   a first circuit portion configured to operate at a first clock rate equal to a sampling rate of the ADC circuit; and
   a second circuit portion configured to operate at a second clock rate higher than the sampling rate of the ADC circuit, wherein the second circuit portion comprises an analog finite impulse response (FIR) filter operated at the second clock rate.

2. An analog-to-digital converter (ADC) circuit comprising:
   a first circuit portion configured to operate at a first clock rate equal to a sampling rate of the ADC circuit; and
   a second circuit portion configured to operate at a second clock rate higher than the sampling rate of the ADC circuit, wherein the ADC circuit comprises a pipelined ADC having a plurality of stages, wherein the second circuit portion comprises one or more initial stages in the plurality of stages of the pipelined ADC and wherein the first circuit portion comprises one or more latter stages in the plurality of stages of the pipelined ADC.

3. The ADC circuit of claim 2, wherein one of the initial stages comprises:
   an ADC configured to be operated at the second clock rate;
   a digital-to-analog converter (DAC) configured to be operated at the second clock rate and having an input coupled to an output of the ADC;
   a combiner having a first input coupled to an input of the ADC and having a second input coupled to an output of the DAC;
   an analog filter having an input coupled to an output of the combiner; and
   a first digital filter having an input coupled to an output of the ADC.

4. The ADC circuit of claim 3, wherein the one of the initial stages further comprises:
   an analog downsampler having an input coupled to an output of the analog filter; and
   a digital downsampler having an input coupled to an output of the first digital filter.

5. The ADC circuit of claim 4, wherein:
   the pipelined ADC further comprises a decoder coupled to outputs of the plurality of stages;
   the one of the initial stages further comprises an amplifier having an input coupled to an output of the analog downsampler and having an output coupled to a subsequent stage in the plurality of stages; and
   an output of the digital downsampler is coupled to the decoder.

6. The ADC circuit of claim 3, wherein a transfer function of the analog filter is similar to a transfer function of the first digital filter.

7. The ADC circuit of claim 3, wherein the one of the initial stages further comprises a second digital filter having an input coupled to an output of the first digital filter.

8. The ADC circuit of claim 7, wherein the second digital filter is programmable.

9. The ADC circuit of claim 7, wherein the second digital filter can be bypassed or can effectively have a unity transfer function.

10. The ADC circuit of claim 7, wherein the second digital filter has a higher order than the first digital filter.

11. The ADC circuit of claim 7, wherein the one of the initial stages further comprises:
    an analog downsampler having an input coupled to an output of the analog filter;
    an amplifier having an input coupled to an output of the analog downsampler; and
    a digital downsampler having an input coupled to an output of the second digital filter, wherein an output of the amplifier is coupled to an analog output of the one of the initial stages and wherein an output of the digital downsampler is coupled to a digital output of the one of the initial stages.

12. The ADC circuit of claim 2, wherein one of the initial stages comprises:
    an amplifier having an output coupled to an output of the one of the initial stages;
    a feedback capacitive element coupled between the output of the amplifier and an input of the amplifier;
    a first set of switches;
    a second set of switches;
    a plurality of capacitive digital-to-analog converters (CDACs) having outputs selectively coupled to an input of the one of the initial stages via the first set of switches and selectively coupled to an input of the amplifier via the second set of switches; and a plurality of quantizers having inputs coupled to the outputs of the plurality of CDACs and selectively coupled to the input of the one of the initial stages via the first set of switches and having outputs coupled to inputs of the plurality of CDACs.

13. The ADC circuit of claim 12, wherein the one of the initial stages further comprises a switch coupled in parallel with the feedback capacitive element.

14. An analog-to-digital converter (ADC) circuit comprising:
a first circuit portion configured to operate at a first clock rate equal to a sampling rate of the ADC circuit; and
a second circuit portion configured to operate at a second clock rate higher than the sampling rate of the ADC circuit, wherein:
the ADC circuit comprises a successive-approximation register (SAR) ADC having a plurality of capacitive digital-to-analog converters (CDACs) and a multi-input comparator, the multi-input comparator having a plurality of inputs coupled to outputs of the plurality of CDACs;
the second circuit portion comprises the plurality of CDACs; and
the first circuit portion comprises the multi-input comparator.

15. The ADC circuit of claim 14, wherein the plurality of inputs of the multi-input comparator have different weights, the different weights being implemented by different sizes of input transistors in the multi-input comparator.

16. The ADC circuit of claim 14, wherein the SAR ADC further comprises logic having an input coupled to an output of the multi-input comparator, having an output coupled to inputs of the plurality of CDACs, and configured to produce a digital output signal at the output of the logic according to the sampling rate of the ADC circuit.

17. The ADC circuit of claim 16, wherein the digital output signal is a linear weighted combination of different samples in the time domain of an input voltage signal at an input of the SAR ADC, based on an operation of a plurality of switches coupled to outputs of the plurality of CDACs and configured to be cycled through at the second clock rate, one of the plurality of switches per clock pulse at the second clock rate.

18. The ADC circuit of claim 14, wherein outputs of the plurality of CDACs are selectively coupled to an input of the SAR ADC via a plurality of switches configured to be cycled through at the second clock rate, one of the plurality of switches per clock pulse at the second clock rate.

19. The ADC circuit of claim 18, wherein the SAR ADC further comprises a plurality of quantizers having inputs selectively coupled to the input of the SAR ADC via the plurality of switches and having outputs coupled to higher significant bit inputs of the plurality of CDACs.

20. The ADC circuit of claim 19, wherein the SAR ADC further comprises logic having an input coupled to an output of the multi-input comparator, having a first output coupled to lower significant bit inputs of the plurality of CDACs, and configured to produce a digital output signal at a second output of the logic according to the sampling rate of the ADC circuit, the digital output signal being a weighted addition of a coarse quantization from one of the plurality of quantizers and a fine quantization based on an output signal from the multi-input comparator.

21. An analog-to-digital converter (ADC) circuit comprising:
a first circuit portion configured to operate at a first clock rate equal to a sampling rate of the ADC circuit; and
a second circuit portion configured to operate at a second clock rate higher than the sampling rate of the ADC circuit, wherein the second clock rate is two times the sampling rate of the ADC circuit.

22. A method of signal conversion, the method comprising converting, using an analog-to-digital converter (ADC) circuit, an analog signal to a digital signal at a sampling rate of the ADC circuit, wherein the converting comprises:
operating a first circuit portion of the ADC circuit at a first clock rate equal to the sampling rate of the ADC circuit; and
operating a second circuit portion of the ADC circuit at a second clock rate higher than the sampling rate of the ADC circuit, wherein operating the second circuit portion comprises operating an analog finite impulse response (FIR) filter in the second circuit portion of the ADC circuit at the second clock rate.

23. A method of signal conversion, the method comprising converting, using an analog-to-digital converter (ADC) circuit, an analog signal to a digital signal at a sampling rate of the ADC circuit, wherein the converting comprises:
operating a first circuit portion of the ADC circuit at a first clock rate equal to the sampling rate of the ADC circuit; and
operating a second circuit portion of the ADC circuit at a second clock rate higher than the sampling rate of the ADC circuit, wherein the ADC circuit comprises a pipelined ADC having a plurality of stages, wherein the second circuit portion comprises one or more initial stages in the plurality of stages of the pipelined ADC, and wherein the first circuit portion comprises one or more latter stages in the plurality of stages of the pipelined ADC.

24. The method of claim 23, wherein:
one of the initial stages comprises an ADC, a digital-to-analog converter (DAC), a combiner, an analog filter, and a first digital filter; and
operating the second circuit portion comprises:
operating the ADC at the second clock rate to convert a stage input analog signal to a stage digital signal;
operating the DAC at the second clock rate to convert the stage digital signal to a stage intermediary analog signal;
determining, using the combiner, a stage residue signal based on a difference between the stage input analog signal and the stage intermediary analog signal;
filtering the stage residue signal with the analog filter to generate a stage filtered residue signal; and
filtering the stage digital signal with the first digital filter to generate a stage filtered digital signal.

25. The method of claim 24, wherein:
operating the second circuit portion further comprises:
downsampling the stage filtered residue signal to generate a stage downsampled residue signal;
amplifying the stage downsampled residue signal to generate a stage amplified residue signal for outputting to a subsequent stage in the pipelined ADC; and
downsampling the stage filtered digital signal to generate a stage downsampled digital signal; and
the converting further comprises combining the stage downsampled digital signal from the one of the initial stages with at least one or more stage digital signals from the one or more latter stages to generate the digital signal for outputting from the ADC circuit.

26. The method of claim 24, wherein a transfer function of the analog filter is similar to a transfer function of the first digital filter.

27. The method of claim 24, wherein the one of the initial stages further comprises a second digital filter and wherein operating the second circuit portion further comprises filtering the stage filtered digital signal with the second digital filter to generate a stage further filtered digital signal.

28. The method of claim 27, further comprising programming the second digital filter before filtering with the second digital filter.

29. The method of claim 27, wherein the second digital filter has a higher order than the first digital filter.

30. The method of claim 24, wherein the one of the initial stages further comprises a second digital filter and wherein operating the second circuit portion further comprises bypassing the second digital filter.

31. The method of claim 23, wherein:
one of the initial stages comprises:
an amplifier having an output coupled to an output of the one of the initial stages;
a feedback capacitive element coupled between the output of the amplifier and an input of the amplifier;
a first set of switches;
a second set of switches;
a plurality of capacitive digital-to-analog converters (CDACs) having outputs selectively coupled to an input of the one of the initial stages via the first set of switches and selectively coupled to an input of the amplifier via the second set of switches; and
a plurality of quantizers having inputs coupled to the outputs of the plurality of CDACs and selectively coupled to the input of the one of the initial stages via the first set of switches and having outputs coupled to inputs of the plurality of CDACs; and operating the second circuit portion comprises:
sequentially sampling the analog signal using the first set of switches according to the second clock rate;
sequentially converting the sampled analog signal to a plurality of coarse digital signals using the plurality of quantizers according to the second clock rate;
controlling inputs of the plurality of CDACs using the plurality of coarse digital signals;
closing the second set of switches to couple remaining portions of the sampled analog signal on the plurality of CDACs to the input of the amplifier; and
applying a finite impulse response (FIR) filter to the remaining portions of the sampled analog signal using the amplifier and the feedback capacitive element.

32. A method of signal conversion, the method comprising converting, using an analog-to-digital converter (ADC) circuit, an analog signal to a digital signal at a sampling rate of the ADC circuit, wherein the converting comprises:
operating a first circuit portion of the ADC circuit at a first clock rate equal to the sampling rate of the ADC circuit; and
operating a second circuit portion of the ADC circuit at a second clock rate higher than the sampling rate of the ADC circuit, wherein:
the ADC circuit comprises a successive-approximation register (SAR) ADC having a plurality of capacitive digital-to-analog converters (CDACs) and a multi-input comparator, the multi-input comparator having a plurality of inputs coupled to outputs of the plurality of CDACs;
the second circuit portion comprises the plurality of CDACs; and
the first circuit portion comprises the multi-input comparator.

33. The method of claim 32, wherein the plurality of inputs of the multi-input comparator have different weights and wherein operating the first circuit portion comprises effectively applying a finite impulse response (FIR) filter, based on the different weights, to a plurality of sampled input signals received by the plurality of inputs of the multi-input comparator.

34. The method of claim 32, wherein the converting further comprises controlling the plurality of CDACs based on the digital signal during the conversion.

35. The method of claim 32, wherein:
operating the second circuit portion comprises cycling through a plurality of switches at the second clock rate, one of the plurality of switches per clock pulse at the second clock rate;
the plurality of switches are coupled to outputs of the plurality of CDACs; and
the digital signal is a linear weighted combination of different samples in the time domain of the analog signal, based on the operation of the plurality of switches.

36. The method of claim 32, wherein:
operating the second circuit portion comprises sequentially sampling the analog signal using a plurality of switches coupled to outputs of the plurality of CDACs, according to the second clock rate; and
operating the first circuit portion comprises:
converting the sampled analog signals on the plurality of CDACs using the multi-input comparator and SAR logic to generate the digital signal at the first clock rate; and
controlling inputs of the plurality of CDACs using the digital signal during the converting of the sampled analog signals.

37. The method of claim 36, wherein during the sequentially sampling, at least one of the plurality of CDACs is inoperable.

38. The method of claim 32, wherein:
operating the second circuit portion comprises:
sequentially sampling the analog signal using a plurality of switches according to the second clock rate, the plurality of switches being coupled to outputs of the CDACs;
sequentially converting the sampled analog signal to a plurality of coarse digital signals using a plurality of quantizers according to the second clock rate; and
controlling higher significant bit inputs of the plurality of CDACs using the plurality of coarse digital signals; and
operating the first circuit portion comprises:
converting remaining portions of the sampled analog signal on the plurality of CDACs using the multi-input comparator and SAR logic to generate a fine digital signal at the first clock rate; and
controlling lower significant bit inputs of the plurality of CDACs using the fine digital signal.

39. The method of claim 38, wherein the multi-input comparator is used to digitize the sampled analog signal for at least some initial conversions.

40. A method of signal conversion, the method comprising converting, using an analog-to-digital converter (ADC) circuit, an analog signal to a digital signal at a sampling rate of the ADC circuit, wherein the converting comprises:
operating a first circuit portion of the ADC circuit at a first clock rate equal to the sampling rate of the ADC circuit; and operating a second circuit portion of the ADC circuit at a second clock rate higher than the sampling rate of the ADC circuit, wherein the second clock rate is more than two times the sampling rate of the ADC circuit.

* * * * *